(12) United States Patent
Takemura

(10) Patent No.: US 10,324,115 B2
(45) Date of Patent: Jun. 18, 2019

(54) MEASUREMENT METHOD FOR A DEVICE, MATRIX DEVICE, AND METHOD FOR DRIVING MATRIX DEVICE

(71) Applicant: SEMICONDUCTOR ENERGY LABORATORY CO., LTD., Atsugi-shi, Kanagawa-ken (JP)

(72) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 131 days.

(21) Appl. No.: 15/510,809

(22) PCT Filed: Sep. 15, 2015

(86) PCT No.: PCT/IB2015/057062
§ 371 (c)(1),
(2) Date: Mar. 13, 2017

(87) PCT Pub. No.: WO2016/046692
PCT Pub. Date: Mar. 31, 2016

(65) Prior Publication Data
US 2018/0203046 A1    Jul. 19, 2018

(30) Foreign Application Priority Data
Sep. 26, 2014 (JP) .................... 2014-196118

(51) Int. Cl.
*G01R 19/25* (2006.01)
*H04N 5/3745* (2011.01)
(Continued)

(52) U.S. Cl.
CPC ......... *G01R 19/2506* (2013.01); *G01R 19/00* (2013.01); *G01R 31/00* (2013.01);
(Continued)

(58) Field of Classification Search
CPC .... G01R 19/00; G01R 19/2506; G01R 31/00; G01R 31/2825; G09G 3/20; G09G 3/30;
(Continued)

(56) References Cited

U.S. PATENT DOCUMENTS 7,068,333 B2 *  6/2006  Ohashi ................ G09G 3/3406
                                                        349/61
7,088,052 B2     8/2006  Kimura
(Continued)

FOREIGN PATENT DOCUMENTS

CN       001637816 A      7/2005
CN       001842835 A     10/2006
(Continued)

OTHER PUBLICATIONS

International Search Report (Application No. PCT/IB2015/057062) dated Dec. 28, 2015.
(Continued)

*Primary Examiner* — Twyler L Haskins
*Assistant Examiner* — Akshay Trehan
(74) *Attorney, Agent, or Firm* — Nixon Peabody LLP; Jeffrey L. Costellia

(57) ABSTRACT

Provided is a method for measuring a current that a component of a matrix device can supply. A device including components (pixels) arranged in a matrix, first wirings, and second wirings and third wirings which cross the first wirings is used. Each component includes a potential supply circuit, a transistor, and a capacitor. The device is designed as follows: at a point in time, one electrode of the capacitor has a potential equal to that of a gate of the transistor, the other electrode of the capacitor has a potential equal to that of the second wiring, one of a source and a drain of the transistor has a potential equal to that of the first wiring, and the other of the source and the drain of the transistor has a
(Continued)

potential equal to that of the third wiring; and the potential of the second wiring and the potential of the third wiring in the case where each component supplies the first wiring with a current in a given direction are different from the potential of the second wiring and the potential of the third wiring in the case where each component supplies the first wiring with a current in the opposite direction.

12 Claims, 9 Drawing Sheets

(51) Int. Cl.
    *H04N 5/357* (2011.01)
    *G01R 31/28* (2006.01)
    *G01R 19/00* (2006.01)
    *G01R 31/00* (2006.01)
    *G09G 3/3225* (2016.01)
    *G09G 3/30* (2006.01)
    *G09G 3/20* (2006.01)
    *H01L 29/786* (2006.01)
    *G09G 3/3233* (2016.01)

(52) U.S. Cl.
    CPC ........... *G01R 31/2825* (2013.01); *G09G 3/20* (2013.01); *G09G 3/30* (2013.01); *G09G 3/3225* (2013.01); *G09G 3/3233* (2013.01); *H01L 29/786* (2013.01); *H04N 5/357* (2013.01); *H04N 5/3745* (2013.01); *G09G 2300/0819* (2013.01); *G09G 2300/0842* (2013.01); *G09G 2300/0861* (2013.01); *G09G 2320/0693* (2013.01)

(58) Field of Classification Search
    CPC ......... G09G 3/3225; G09G 2300/0819; G09G 2300/0842; G09G 2300/0861; G09G 2320/0693; H01L 29/786; H01L 29/772; H04N 5/357; H04N 5/374; H04N 5/3745
    See application file for complete search history.

(56) References Cited

U.S. PATENT DOCUMENTS

| | | | |
|---|---|---|---|
| 7,122,970 | B2 | 10/2006 | Ono et al. |
| 7,868,856 | B2 | 1/2011 | Fish |
| 8,947,328 | B2 | 2/2015 | Kimura |
| 8,982,091 | B1 | 3/2015 | Mohindra |
| 2005/0057193 | A1 | 3/2005 | Ono et al. |
| 2005/0179628 | A1 | 8/2005 | Kimura |
| 2006/0261841 | A1 | 11/2006 | Fish |
| 2008/0266214 | A1* | 10/2008 | Naugler ............... G09G 3/3225 345/76 |
| 2008/0312854 | A1 | 12/2008 | Chemin et al. |
| 2009/0160742 | A1* | 6/2009 | Mizukoshi ........... G09G 3/3233 345/77 |
| 2009/0195483 | A1* | 8/2009 | Naugler, Jr. ......... G09G 3/3233 345/76 |
| 2010/0220118 | A1* | 9/2010 | Kanegae ............. G09G 3/3233 345/690 |
| 2010/0259527 | A1* | 10/2010 | Odawara .............. G09G 3/3233 345/211 |
| 2011/0032243 | A1* | 2/2011 | Tsuji .................... G09G 3/3283 345/212 |
| 2013/0211757 | A1 | 8/2013 | Miyamoto |
| 2013/0271426 | A1 | 10/2013 | Yumoto et al. |
| 2014/0118287 | A1 | 5/2014 | Miyamoto |
| 2014/0125629 | A1 | 5/2014 | Miyamoto et al. |
| 2014/0132541 | A1 | 5/2014 | Miyamoto et al. |
| 2014/0132561 | A1 | 5/2014 | Miyamoto et al. |
| 2014/0132562 | A1 | 5/2014 | Miyamoto et al. |
| 2014/0139482 | A1 | 5/2014 | Miyamoto et al. |
| 2014/0139483 | A1 | 5/2014 | Miyamoto et al. |
| 2014/0149059 | A1 | 5/2014 | Miyamoto et al. |
| 2014/0152602 | A1 | 6/2014 | Miyamoto et al. |
| 2014/0160070 | A1 | 6/2014 | Miyamoto et al. |
| 2014/0218645 | A1 | 8/2014 | Miyamoto |
| 2014/0375608 | A1 | 12/2014 | Yumoto et al. |
| 2015/0179095 | A1 | 6/2015 | Kimura |
| 2016/0071446 | A1 | 3/2016 | Miyake |
| 2016/0071447 | A1 | 3/2016 | Takemura et al. |
| 2016/0349923 | A1 | 12/2016 | Miyamoto et al. |
| 2017/0024039 | A1 | 1/2017 | Miyamoto |

FOREIGN PATENT DOCUMENTS

| | | |
|---|---|---|
| CN | 101425260 A | 5/2009 |
| GB | 0320212 | 10/1929 |
| GB | 0320212 | 10/2003 |
| JP | 2003-195813 A | 7/2003 |
| JP | 2005-070614 A | 3/2005 |
| JP | 2007-504487 | 3/2007 |
| KR | 2003-0022084 A | 3/2003 |
| KR | 2006-0132794 A | 12/2006 |
| TW | I221268 | 9/2004 |
| TW | I237698 | 8/2005 |
| WO | WO-2005/022500 | 3/2005 |

OTHER PUBLICATIONS

Written Opinion (Application No. PCT/IB2015/057062) dated Dec. 28, 2015.

Hamaguchi.M et al., "A 240Hz-Reporting-Rate 143×81 Mutual-Capacitance Touch-Sensing Analog Front-End IC With 37dB SNR for 1mm-Diameter Stylus", ISSCC 2014 (Digest of Technical Papers. IEEE International Solid-State Circuits Conference), Feb. 11, 2014, pp. 214-216.

\* cited by examiner

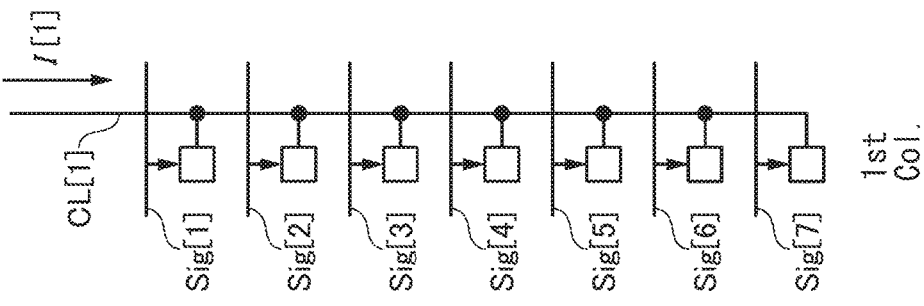
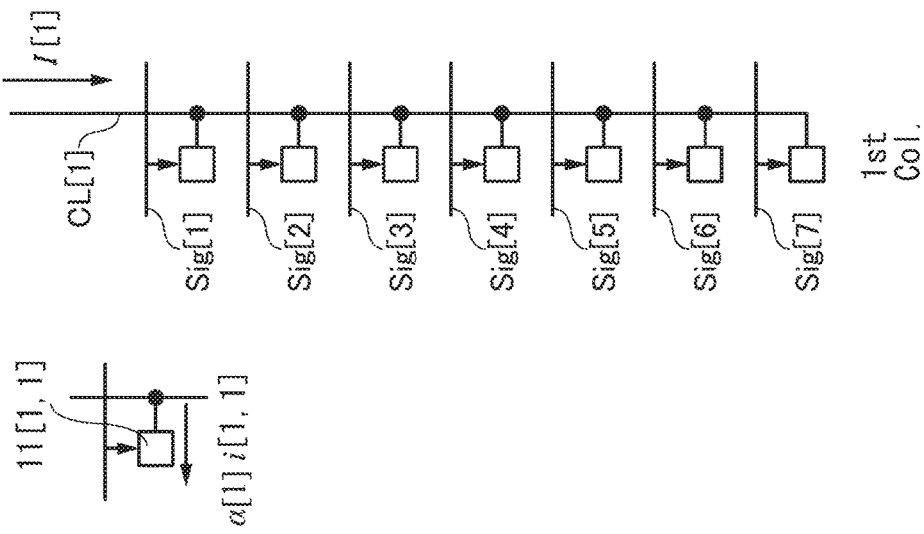
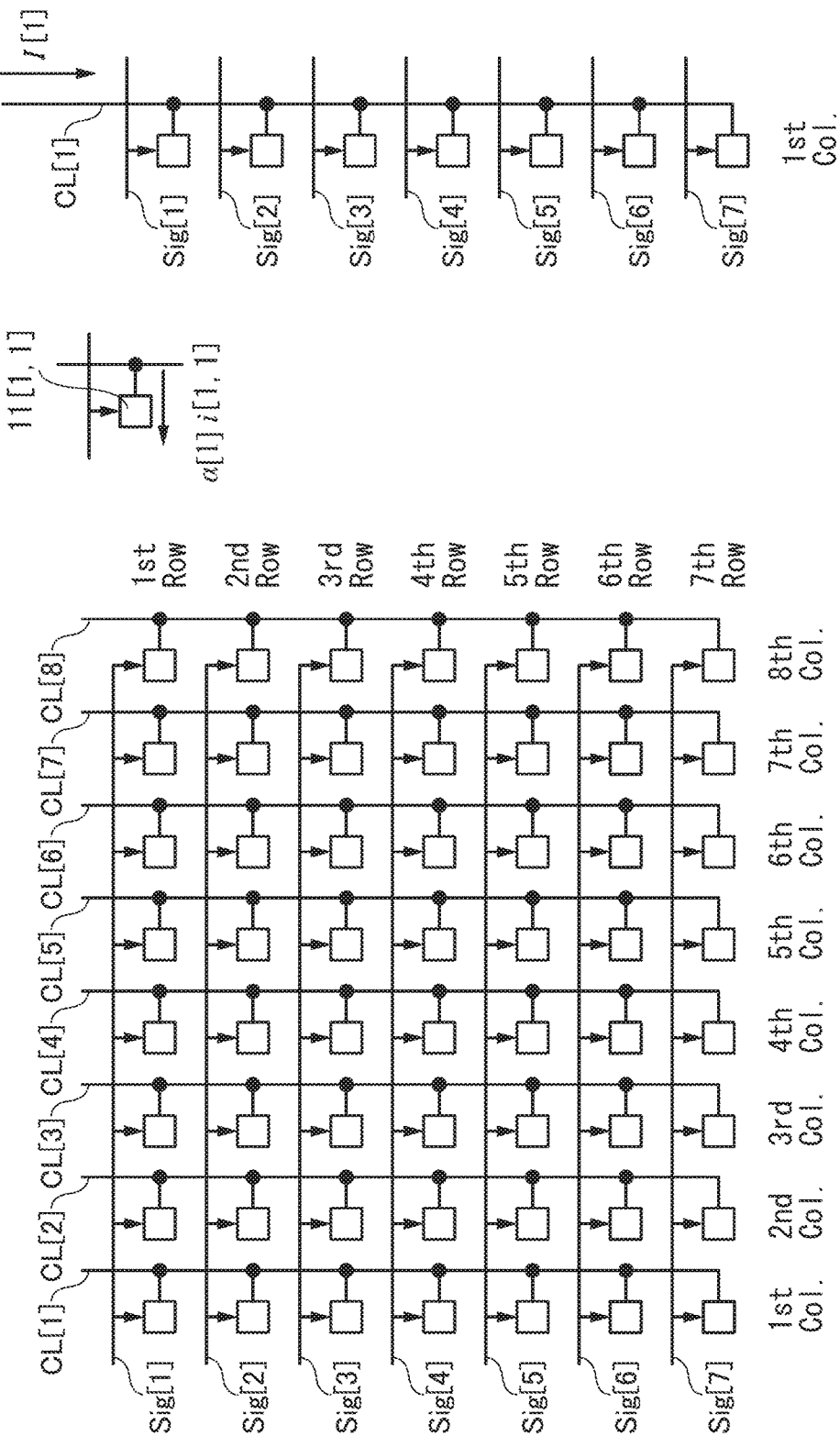

$\alpha[1] = 1$ $V0 > VL$ $\alpha[1] = -1$ $VH > V0$

MEASUREMENT METHOD FOR A DEVICE, MATRIX DEVICE, AND METHOD FOR DRIVING MATRIX DEVICE

TECHNICAL FIELD

This disclosure relates to a matrix device which performs processing such as display or detection with a current flowing through an electrical element included therein.

BACKGROUND ART

In an active matrix display device with light-emitting elements, variation in the threshold values of transistors (driver transistors) which are provided in respective pixels and control the values of currents supplied to the light-emitting elements in accordance with image signals is reflected on the luminance of the light-emitting elements. Patent Document 1 discloses a display device in which, in order to prevent variation in threshold values from affecting the luminance of light-emitting elements, characteristics of a driver transistor of each pixel are measured in advance and an image signal corrected on the basis of the measured characteristics is supplied to the pixel.

Specifically, the potentials of driver transistors of pixels in a given row are set to a specific value such that the transistors operate in a saturation region, and currents flowing through the individual driver transistors are measured. Such operation is sequentially performed on the driver transistors of the pixels in all rows.

Note that such a problem is common to not only display devices but all devices that include components (e.g., pixels) arranged in a matrix and perform processing such as display, measurement, detection, or arithmetic operation with a current flowing through one or more electrical elements (e.g., transistors) existing in each component.

PRIOR ART DOCUMENT

Patent Document

[Patent Document 1] Specification of U.S. Pat. No. 7,088,052

SUMMARY OF THE INVENTION

Problem to be Solved by the Invention

Provided is a novel method for measuring the current characteristics of an electrical element in a matrix device, a novel device to which such a measurement method can be applied, a method for setting a device by such a measurement method, a manufacturing method thereof, or the like.

Means for Solving the Problem

As an example, a device is given which includes components arranged in a matrix and a wiring and in which an electrical element included in each component can supply a current to the wiring. When N components can supply currents to the wiring, the current directions of the N components are individually set and a current flowing through the wiring is measured N times. Here, the direction of the current flowing through the electrical element can be changed. Furthermore, the N measurements differ from each other in the combination of the current directions of the N components. Furthermore, the magnitude of the current flowing through each electrical element is calculated on the basis of currents obtained by the N measurements and the combinations of the current directions in the N measurements.

Another example is a measurement method for a device including N components, a first wiring, and second wirings which cross the first wiring. Each component can supply the first wiring with a current whose direction can be changed. Each component includes a potential supply circuit, a transistor, and a capacitor. The design is as follows: at a point in time, one of a source and a drain of the transistor has a potential equal to that of the first wiring, and the other of the source and the drain of the transistor has a potential equal to that of a third wiring; and the potential of the second wiring in the case where each component supplies the first wiring with a current in a first direction is different from the potential of the second wiring in the case where each component supplies the first wiring with a current in a second direction opposite to the first direction. The method includes a process in which the current directions of the N components are individually set and a current flowing through the first wiring is measured N times and a process in which the magnitude of a current flowing through each electrical element is calculated on the basis of currents I[1] to I[N] obtained by the N measurements and the combinations of the current directions of the components in the N measurements, whereby the magnitude of the current supplied from the component to the wiring is determined. The method is characterized in that the N measurements differ from each other in the combination of the current directions of the N components and that the magnitude of the current flowing through each electrical element is calculated using a polynomial of the currents I[1] to I[N].

Another example is a measurement method for a device including components arranged in a matrix with N rows and M columns (N and M are each an integer of 2 or more), M first wirings, and N second wirings which cross the first wirings. Each component can supply one of the M first wirings with a current whose direction can be changed. Each component includes a potential supply circuit, a transistor, and a capacitor. The design is as follows: at a point in time, one of a source and a drain of the transistor of each component has a potential equal to that of the first wiring, and the other of the source and the drain of the transistor has a potential equal to that of the second wiring; and the potential of the second wiring in the case where each component supplies the first wiring with a current in a first direction is different from the potential of the second wiring in the case where each component supplies the first wiring with a current in a second direction opposite to the first direction. The method includes a process in which the potentials of the N second wirings are individually set and currents flowing through the M first wirings are each measured N times and a process in which the magnitude of a current flowing through each electrical element in an m-th column (m is an integer of greater than or equal to 1 and less than or equal to M) is calculated on the basis of currents I[1,m] to I[N,m] of the first wiring in the m-th column, which are obtained by the N measurements, and the combinations of the potentials of the N second wirings in the N measurements, whereby the magnitude of the current supplied from each component to the corresponding first wiring is determined. The method is characterized in that the N measurements differ from each other in the combination of the potentials of the N second wirings and that the magnitude of the current flowing through each electrical element in the m-th column is calculated using a polynomial of the currents I[1,m] to I[N,m]. Here, in some cases, the polynomial of the currents I[1,m] to I[N,m] can be expressed as a product of an inverse matrix of a square matrix A with N rows and a matrix with N rows and M columns whose elements are the currents I[1,m] to I[N,m], and no element of the inverse matrix of the square matrix A with N rows is 0. In addition, all the elements of the inverse matrix of the square matrix A with N rows have the same magnitude in some cases. Furthermore, the square matrix A with N rows may be a Hadamard matrix. Alternatively, the square matrix A with N rows may be a circulant matrix. In this case, a circulant matrix in which N is a multiple of 4 and the sum of elements of a given row of the square matrix A with N rows is 2 or −2 may be used.

The above measurement method may be characterized by being practiced using the device which further includes N third wirings and is designed as follows: each third wiring has a potential equal to that of the other electrode of the capacitor of the corresponding component; and the potential of the third wiring in the case where each component supplies the first wiring with the current in the first direction is different from the potential of the third wiring in the case where each component supplies the first wiring with the current in the second direction. Another example is a matrix device with a configuration in which any one of the above measurement methods can be executed. Alternatively, the matrix device is a display device or a photodetector device. Another example is a method for driving a matrix device, characterized in that input or output data is corrected on the basis of the current values of components measured by any one of the above measurement methods.

Effect of the Invention

For example, the reliability in measuring a current value can be improved; other effects can be derived from the description of the specification, the drawings, the claims, and the like.

BRIEF DESCRIPTION OF THE DRAWINGS

FIG. 1 Diagrams showing a configuration example of a matrix device.

MODES FOR CARRYING OUT THE INVENTION

Figure 2A:
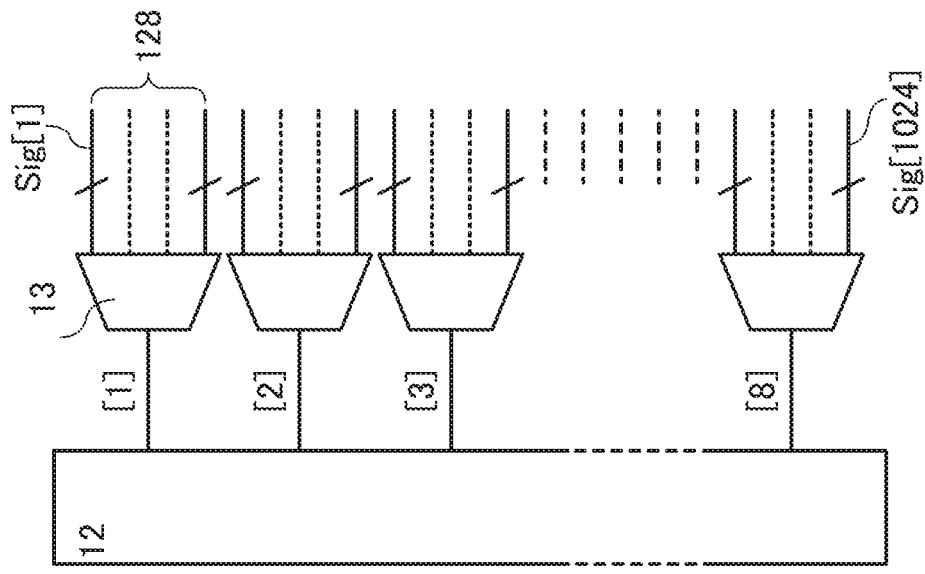
FIG. 2 Diagrams showing configuration examples of a matrix device.

Embodiments will be described below in detail with reference to the drawings. Note that the following description does not imply limitation. It is easily understood by those skilled in the art that the modes and the details can be modified in various ways without departing from the spirit and the scope and that a combination of techniques disclosed herein, a combination with another technique, or the like is possible. Therefore, the interpretation should not be made as being limited to the following description of the embodiments and examples. In addition, in the embodiments and examples described below, the same portions or portions having similar functions are commonly denoted by the same reference numerals in different drawings, and repetitive description thereof is omitted.

In addition, in the drawings, the size, the layer thickness, or the region is exaggerated for clarity in some cases. Therefore, the scale is not necessarily limited to the illustrated one. Note that the drawings schematically show ideal examples; the shape, the value, and the like are not limited to those shown in the drawings. For example, variation in signal, voltage, or current due to noise, variation in signal, voltage, or current due to a difference in timing, or the like can be involved.

In addition, in this specification and the like, a transistor is an electrical element having at least three terminals: a gate, a drain, and a source. Furthermore, a channel region is provided between the drain (a drain terminal, a drain region, or a drain electrode) and the source (a source terminal, a source region, or a source electrode), and a current can flow through the drain, the channel region, and the source. Here, since the source and the drain may interchange with each other depending on the structure, the operating conditions, or the like of the transistor, it is difficult to define which is a source or a drain. For this reason, instead of calling a portion functioning as a source and a portion functioning as a drain "source" and "drain", one of the source and the drain is referred to as a first electrode, and the other of the source and the drain is referred to as a second electrode in some cases.

In addition, in this specification, a node refers to a given point on a wiring provided to connect electrical elements electrically.

Note that in this specification, ordinal numbers such as "first", "second", and "third" are used in order to avoid confusion among components and do not limit them numerically.

Note that the arrangement of circuit blocks in a drawing specifies the positional relation for description. Even when a drawing shows that separate functions are achieved in different circuit blocks, an actual circuit or region may be configured so that separate functions are achieved in the same circuit or the same region. Furthermore, the function of each circuit block in a drawing specifies a function for description. Even when one circuit block is illustrated, an actual circuit or region may be configured so that processing which is supposed to be performed by the one circuit block is performed in a plurality of circuit blocks.

Embodiment 1

FIG. 1(A) illustrates a matrix device with seven rows and eight columns. Here, a plurality of pixels 11 is arranged in a matrix. For example, the pixel in the seventh row and the eighth column is referred to as a pixel 11[7,8]. Furthermore, a plurality of signal lines Sig and a plurality of signal lines CL are provided so as to cross each other. For example, the signal line in the first row is referred to as a signal line Sig[1], and the signal line in the first column is referred to as a signal line CL[1].

Each pixel 11 supplies a current to the corresponding signal line CL in accordance with a signal of the corresponding signal line Sig. The signal line Sig determines the direction of the current supplied from the pixel 11 to the signal line CL. For example, as illustrated in FIG. 1(B), a current α[1]i[1,1] flows through the pixel 11[1,1] in the direction of the arrow. Here, α[1] is 1 when a current flows as illustrated, and α[1] is −1 when a current flows in the direction opposite to that illustrated. i[1,1] denotes a current value specific to the pixel 11[1,1] and is not necessarily the same as a current value i of another pixel. Furthermore, regarding the current value i, a temporal change, a change depending on the current direction, and potential fluctuation (so-called voltage drop) due to a wiring resistance and a current flowing through the wiring are assumed to be negligible. Note that this description does not mean that longer-term use makes no change in the current value i. In addition, the case where a change depending on the current direction is not negligible will be described later.

$$\begin{pmatrix} I[1]_{t=1} \\ I[1]_{t=2} \\ I[1]_{t=3} \\ I[1]_{t=4} \\ I[1]_{t=5} \\ I[1]_{t=6} \\ I[1]_{t=7} \\ I[1]_{t=8} \end{pmatrix} = A \begin{pmatrix} i[1,1] \\ i[2,1] \\ i[3,1] \\ i[4,1] \\ i[5,1] \\ i[6,1] \\ i[7,1] \\ i[8,1] \end{pmatrix},$$

where

Here, focus is placed on the first column. As illustrated in FIG. 1(C), a current I[1] flowing through the signal line CL[1] is the sum of currents flowing through the pixels 11[1,1] to 11 [7,1]. However, not all signals of the signal lines Sig are necessarily the same. Note that here, pixels other than those illustrated do not supply any current to the signal line CL.

That is, a current $I[1]_{t=1}$ at time t=1 can be represented by $$I[1]_{t=1} = \alpha[1]_{t=1}i[1,1] + \alpha[2]_{t=1}i[2,1] + \ldots + \alpha[8]_{t=1}i[8,1] = \sum_{n=1}^{8} \alpha[n]_{t=1}i[n,1].$$ [Formula 1]

Similarly, a current $I[1]_{t=2}$ at time t=2 can be represented by $$I[1]_{t=2} = \alpha[1]_{t=2}i[1,1] + \alpha[2]_{t=2}i[2,1] + \ldots + \alpha[7]_{t=2}i[8,1] = \sum_{n=1}^{8} \alpha[n]_{t=2}i[n,1].$$ [Formula 2]

Subsequent equations for currents $I[1]_{t=3}$ to $I[1]_{t=7}$ at time t=3 to 7 are obtained in a similar manner.

Here, the currents $I[1]_{t=1}$ to $I[1]_{t=7}$ are measurable physical quantities, and the current values i[1,1] to i[7,1] are unknowns. In this case, these equations are simultaneous equations with seven unknowns. Accordingly, the current values i[1,1] to i[7,1] can be determined by solving these equations.

That is, the equations are represented by

[Formula 3]

$$A = \begin{pmatrix} \alpha[1]_{t=1} & \alpha[2]_{t=1} & \alpha[3]_{t=1} & \alpha[4]_{t=1} & \alpha[5]_{t=1} & \alpha[6]_{t=1} & \alpha[7]_{t=1} & \alpha[8]_{t=1} \\ \alpha[1]_{t=2} & \alpha[2]_{t=2} & \alpha[3]_{t=2} & \alpha[4]_{t=2} & \alpha[5]_{t=2} & \alpha[6]_{t=2} & \alpha[7]_{t=2} & \alpha[8]_{t=2} \\ \alpha[1]_{t=3} & \alpha[2]_{t=3} & \alpha[3]_{t=3} & \alpha[4]_{t=3} & \alpha[5]_{t=3} & \alpha[6]_{t=3} & \alpha[7]_{t=3} & \alpha[8]_{t=3} \\ \alpha[1]_{t=4} & \alpha[2]_{t=4} & \alpha[3]_{t=4} & \alpha[4]_{t=4} & \alpha[5]_{t=4} & \alpha[6]_{t=4} & \alpha[7]_{t=4} & \alpha[8]_{t=4} \\ \alpha[1]_{t=5} & \alpha[2]_{t=5} & \alpha[3]_{t=5} & \alpha[4]_{t=5} & \alpha[5]_{t=5} & \alpha[6]_{t=5} & \alpha[7]_{t=5} & \alpha[8]_{t=5} \\ \alpha[1]_{t=6} & \alpha[2]_{t=6} & \alpha[3]_{t=6} & \alpha[4]_{t=6} & \alpha[5]_{t=6} & \alpha[6]_{t=6} & \alpha[7]_{t=6} & \alpha[8]_{t=6} \\ \alpha[1]_{t=7} & \alpha[2]_{t=7} & \alpha[3]_{t=7} & \alpha[4]_{t=7} & \alpha[5]_{t=7} & \alpha[6]_{t=7} & \alpha[7]_{t=7} & \alpha[8]_{t=7} \\ \alpha[1]_{t=8} & \alpha[2]_{t=8} & \alpha[3]_{t=8} & \alpha[4]_{t=8} & \alpha[5]_{t=8} & \alpha[6]_{t=8} & \alpha[7]_{t=8} & \alpha[8]_{t=8} \end{pmatrix}.$$ [Formula 4]

An inverse matrix $A^{-1}$ of A is represented by $$\begin{pmatrix} i[1,1] \\ i[2,1] \\ i[3,1] \\ i[4,1] \\ i[5,1] \\ i[6,1] \\ i[7,1] \\ i[8,1] \end{pmatrix} = A^{-1} \begin{pmatrix} I[1]_{t=1} \\ I[1]_{t=2} \\ I[1]_{t=3} \\ I[1]_{t=4} \\ I[1]_{t=5} \\ I[1]_{t=6} \\ I[1]_{t=7} \\ I[1]_{t=8} \end{pmatrix}.$$ [Formula 5]

Although the above description focuses on only the first column, it is possible to measure currents flowing through another signal line at the same time. Accordingly, for $$I = \begin{pmatrix} I[1]_{t=1} & I[2]_{t=1} & I[3]_{t=1} & I[4]_{t=1} & I[5]_{t=1} & I[6]_{t=1} & I[7]_{t=1} & I[8]_{t=1} \\ I[1]_{t=2} & I[2]_{t=2} & I[3]_{t=2} & I[4]_{t=2} & I[5]_{t=2} & I[6]_{t=2} & I[7]_{t=2} & I[8]_{t=2} \\ I[1]_{t=3} & I[2]_{t=3} & I[3]_{t=3} & I[4]_{t=3} & I[5]_{t=3} & I[6]_{t=3} & I[7]_{t=3} & I[8]_{t=3} \\ I[1]_{t=4} & I[2]_{t=4} & I[3]_{t=4} & I[4]_{t=4} & I[5]_{t=4} & I[6]_{t=4} & I[7]_{t=4} & I[8]_{t=4} \\ I[1]_{t=5} & I[2]_{t=5} & I[3]_{t=5} & I[4]_{t=5} & I[5]_{t=5} & I[6]_{t=5} & I[7]_{t=5} & I[8]_{t=5} \\ I[1]_{t=6} & I[2]_{t=6} & I[3]_{t=6} & I[4]_{t=6} & I[5]_{t=6} & I[6]_{t=6} & I[7]_{t=6} & I[8]_{t=6} \\ I[1]_{t=7} & I[2]_{t=7} & I[3]_{t=7} & I[4]_{t=7} & I[5]_{t=7} & I[6]_{t=7} & I[7]_{t=7} & I[8]_{t=7} \\ I[1]_{t=8} & I[2]_{t=8} & I[3]_{t=8} & I[4]_{t=8} & I[5]_{t=8} & I[6]_{t=8} & I[7]_{t=8} & I[8]_{t=8} \end{pmatrix}$$

[Formula 6]

and $$\iota = \begin{pmatrix} i[1,1] & i[1,2] & i[1,3] & i[1,4] & i[1,5] & i[1,6] & i[1,7] & i[1,8] \\ i[2,1] & i[2,2] & i[2,3] & i[2,4] & i[2,5] & i[2,6] & i[2,7] & i[2,8] \\ i[3,1] & i[3,2] & i[3,3] & i[3,4] & i[3,5] & i[3,6] & i[3,7] & i[3,8] \\ i[4,1] & i[4,2] & i[4,3] & i[4,4] & i[4,5] & i[4,6] & i[4,7] & i[4,8] \\ i[5,1] & i[5,2] & i[5,3] & i[5,4] & i[5,5] & i[5,6] & i[5,7] & i[5,8] \\ i[6,1] & i[6,2] & i[6,3] & i[6,4] & i[6,5] & i[6,6] & i[6,7] & i[6,8] \\ i[7,1] & i[7,2] & i[7,3] & i[7,4] & i[7,5] & i[7,6] & i[7,7] & i[7,8] \end{pmatrix},$$

[Formula 7]

$I = A\iota$ [Formula 8]

is satisfied. Hence, $\iota = A^{-1} I$ [Formula 9]

is obtained. That is, a current value i[n,m] can be expressed as a polynomial of a current $I[m]_{t=n}$. Here, n is an integer of 7 or less, and m is an integer of 8 or less.

The above description relating to the matrix device with seven rows and eight columns can also be applied to a matrix device with an arbitrary scale. That is, in a matrix device with N rows and M columns, the matrix A is a square matrix with N rows, and the matrix I and the matrix t are each a matrix with N rows and M columns.

Note that A may be such a special matrix that $A^{-1}$ is a multiple of A. For example, a Hadamard (Hadamard) matrix satisfies this condition; an inverse matrix $H^{-1}$ of a Hadamard matrix H with N rows is 1/N of H. Note that in the case of using a Hadamard matrix as the matrix A, all the elements of the first row and the first column are the same, and in the other rows and columns, the sum of elements is 0.

Note that the coefficient by which the matrix is multiplied (1/N in the case of the inverse matrix $H^{-1}$ of the Hadamard matrix H) is not important and, in practice, may be changed for convenience in calculation. For example, the coefficient 1/N of the inverse matrix $H^{-1}$ of the Hadamard matrix H may be regarded as 1. This operation enables the above polynomial (the formula for calculating the current value i[n,m]) to be represented by an addition or subtraction of the current $I[m]_{t=n}$, leading to a significant reduction in calculation amount.

In general, a Hadamard matrix is a square matrix in which the number of rows is a multiple of 4 and thus is difficult to apply as it is to a square matrix with seven rows, such as the matrix A derived from the matrix device with seven rows in FIG. 1(A).

In that case, for example, it is preferable that the matrix device in FIG. 1(A) be divided into the first to fourth rows and the fourth to seventh rows and a measurement similar to the above be separately performed. In this case, the fourth row is measured twice, and thus, two results are obtained. Only one of the results may be employed, or the average value of them may be used as the result. Furthermore, it is necessary that no current be supplied from the pixels 11 in the fifth to seventh rows to the signal line CL in a period in which characteristics of the first to fourth rows are measured.

Alternatively, for example, the measurement may be as follows: the first to fourth rows are measured in a first measurement, the second to fifth rows are measured in a second measurement, the third to sixth rows are measured in a third measurement, the fourth to seventh rows are measured in a fourth measurement, the first row and the fifth to seventh rows are measured in a fifth measurement, the first row, the second row, the sixth row, and the seventh row are measured in a sixth measurement, and the first to third rows and the seventh row are measured in a seventh measurement. In this case, each row is measured four times. The average value of the results may be used.

Alternatively, the calculation may be performed with an additional virtual row including the pixels 11 whose current values i are 0. Needless to say, the virtual row (virtual pixels) is not provided with the signal line Sig that transmits an actual signal. Since the current values are 0, no current is supplied to the signal line CL regardless of the signal of the signal line Sig. For example, when the matrix device has seven rows and the matrix A is a square matrix with eight rows, the measurement is performed with one additional virtual row, and calculation is performed using the obtained currents I and $A^{-1}$. Similarly, when the matrix device has six rows, two virtual rows are added. In this case, the current values i of the pixels 11 in the virtual rows should be ideally 0; however, a measurement error might cause the calculation result to be a numerical value that is not 0.

Here, in the following respects, it is necessary that at least two elements of each row of $A^{-1}$ should not be 0. For example, a Hadamard matrix is preferable because no element of its inverse matrix is 0. In contrast, as an example of a matrix in which all but one element of each row are 0, an identity matrix (in which all but the diagonal components are 0) can be given. For example, when A is an identity matrix, $A^{-1}$ is also an identity matrix. Accordingly, $$i[1,1]=I[1]_{t=1} \qquad \text{[Formula 10]}$$

is satisfied. Note that in the case where A is an identity matrix, currents are measured row by row as in a conventional method. Here, the current $I[1]_{t=1}$, though measurable, includes a measurement error, a noise, and the like. In the conventional method, especially a noise has a considerable influence, and a single measurement is not enough to determine whether an abnormal value is caused by an accidental noise; therefore, the measurement needs to be performed plural times. For example, in a matrix device with seven rows, one measurement per row, i.e., seven measurements need to be performed; moreover, this procedure is repeated plural times.

In contrast, in the case where the current value i[1,1] is represented by the polynomial of the currents $I[1]_{t=1}$ to $I[1]_{t=7}$, an abnormal value, if any, included in one of the currents $I[1]_{t=1}$ to $I[1]_{t=7}$ is canceled by the other values; thus, the obtained current value i[1,1] is less likely to be an abnormal value. This is because the measurements of the currents $i[1]_{t=1}$ to $I[1]_{t=7}$ are performed at different points in time (temporally dispersed), and thus, the possibility that abnormal values are included in more than one of them is very low.

Specific examples will be described below. First, a circulant matrix (Circulant matrix) in which only one element of each row of the matrix A is −1 and the other elements are 1 will be considered. This matrix is referred to as a first matrix $A_1$, namely $$A_1 = \begin{pmatrix} -1 & 1 & 1 & 1 & 1 & 1 & 1 \\ 1 & -1 & 1 & 1 & 1 & 1 & 1 \\ 1 & 1 & -1 & 1 & 1 & 1 & 1 \\ 1 & 1 & 1 & -1 & 1 & 1 & 1 \\ 1 & 1 & 1 & 1 & -1 & 1 & 1 \\ 1 & 1 & 1 & 1 & 1 & -1 & 1 \\ 1 & 1 & 1 & 1 & 1 & 1 & -1 \end{pmatrix}. \qquad \text{[Formula 11]}$$

Its inverse matrix is represented by $$A_1^{-1} = \frac{1}{10}\begin{pmatrix} -4 & 1 & 1 & 1 & 1 & 1 & 1 \\ 1 & -4 & 1 & 1 & 1 & 1 & 1 \\ 1 & 1 & -4 & 1 & 1 & 1 & 1 \\ 1 & 1 & 1 & -4 & 1 & 1 & 1 \\ 1 & 1 & 1 & 1 & -4 & 1 & 1 \\ 1 & 1 & 1 & 1 & 1 & -4 & 1 \\ 1 & 1 & 1 & 1 & 1 & 1 & -4 \end{pmatrix}. \qquad \text{[Formula 12]}$$

Next, a circulant matrix in which only two successive elements of each row are −1 and the other elements are 1 will be considered. This matrix is referred to as a second matrix $A_2$, namely $$A_2 = \begin{pmatrix} -1 & -1 & 1 & 1 & 1 & 1 & 1 \\ 1 & -1 & -1 & 1 & 1 & 1 & 1 \\ 1 & 1 & -1 & -1 & 1 & 1 & 1 \\ 1 & 1 & 1 & -1 & -1 & 1 & 1 \\ 1 & 1 & 1 & 1 & -1 & -1 & 1 \\ 1 & 1 & 1 & 1 & 1 & -1 & -1 \\ -1 & 1 & 1 & 1 & 1 & 1 & -1 \end{pmatrix}. \qquad \text{[Formula 13]}$$

Its inverse matrix is represented by $$A_2^{-1} = \frac{1}{6}\begin{pmatrix} -1 & 2 & -1 & 2 & -1 & 2 & -1 \\ -1 & -1 & 2 & -1 & 2 & -1 & 2 \\ 2 & -1 & -1 & 2 & -1 & 2 & -1 \\ -1 & 2 & -1 & -1 & 2 & -1 & 2 \\ 2 & -1 & 2 & -1 & -1 & 2 & -1 \\ -1 & 2 & -1 & 2 & -1 & -1 & 2 \\ 2 & -1 & 2 & -1 & 2 & -1 & -1 \end{pmatrix}. \qquad \text{[Formula 14]}$$

Here, both in the first matrix $A_1$ and in the second matrix $A_2$, the sum of elements is equal in all the rows (5 in the first matrix $A_1$, and 3 in the second matrix $A_2$). Therefore, when the current values i[1,1] to i[7,1] are approximately the same (for example, when the ratio of the maximum to the minimum is 1.1 or less), the currents $I[1]_{t=1}$ to $I[1]_{t=7}$ probably have approximately the same magnitude. Specifically, the magnitude in the first matrix $A_1$ and that in the second matrix $A_2$ are probably approximately five times and approximately three times, respectively, the average of the current values i[1,1] to i[7,1].

As an example, the current value i[1,1] derived from the first matrix $A_1$ is represented by $$i[1,1]=\frac{1}{10}(-4I[1]_{t=1}+I[1]_{t=2}+I[1]_{t=3}+I[1]_{t=4}+I[1]_{t=5}+I[1]_{t=6}+I[1]_{t=7}) \qquad \text{[Formula 15]}$$

and that derived from the second matrix $A_2$ is represented by $$i[1,1]=\frac{1}{6}(-I[1]_{t=1}+2I[1]_{t=2}-I[1]_{t=3}+2I[1]_{t=4}-I[1]_{t=5}+2I[1]_{t=6}-I[1]_{t=7}) \qquad \text{[Formula 16]}$$

Here, the magnitude of the terms in these polynomials is considered. Regarding the first matrix $A_1$, the largest term is approximately four times the smallest one, and regarding the second matrix $A_2$, approximately twice. In this case, it can be concluded as follows: since the largest term has less contribution, the second matrix $A_2$ allows higher reliability of the current value i[1,1]. Note that it can be easily understood that the same conclusion is drawn even when rows of the above first matrix $A_1$ (or second matrix $A_2$) are exchanged (the solutions do not change because the exchange of rows only results in a changed order of the simultaneous equations with multiple unknowns).

The feature that the sum of elements is equal in all the rows is peculiar to a circulant matrix. Thus, when a circulant matrix whose inverse matrix consists of elements with the same magnitude is used, the contribution of the terms can be equal. As such a matrix, the following circulant matrix (third matrix $A_3$) can be given: a square matrix with eight rows, in which three elements of each row are −1 and the other elements are all 1.

That is, $$A_3 = \begin{pmatrix} -1 & -1 & -1 & 1 & 1 & 1 & 1 & 1 \\ 1 & -1 & -1 & -1 & 1 & 1 & 1 & 1 \\ 1 & 1 & -1 & -1 & -1 & 1 & 1 & 1 \\ 1 & 1 & 1 & -1 & -1 & -1 & 1 & 1 \\ 1 & 1 & 1 & 1 & -1 & -1 & -1 & 1 \\ 1 & 1 & 1 & 1 & 1 & -1 & -1 & -1 \\ -1 & 1 & 1 & 1 & 1 & 1 & -1 & -1 \\ -1 & -1 & 1 & 1 & 1 & 1 & 1 & -1 \end{pmatrix}$$ [Formula 17]

The inverse matrix of this matrix is represented by $$A_3^{-1} = \frac{1}{4}\begin{pmatrix} -1 & 1 & 1 & -1 & 1 & 1 & -1 & 1 \\ 1 & -1 & 1 & 1 & -1 & 1 & 1 & -1 \\ -1 & 1 & -1 & 1 & 1 & -1 & 1 & 1 \\ 1 & -1 & 1 & -1 & 1 & 1 & -1 & 1 \\ 1 & 1 & -1 & 1 & -1 & 1 & 1 & -1 \\ -1 & 1 & 1 & -1 & 1 & -1 & 1 & 1 \\ 1 & -1 & 1 & 1 & -1 & 1 & -1 & 1 \\ 1 & 1 & -1 & 1 & 1 & -1 & 1 & -1 \end{pmatrix}$$ [Formula 18]

where all the elements have the same magnitude.

Note that as in the case of the above Hadamard matrix, the coefficient ¼ of the inverse matrix may be regarded as 1. Thus, in a polynomial obtained from this inverse matrix, the current value i[n,m] is represented by an addition or subtraction of the current I[m]$_{t=n}$ as in the case of the Hadamard matrix; accordingly, the calculation amount is significantly reduced.

Note that this matrix is a non-limiting example. In general, when elements of a circulant square matrix with 4N rows (N is an integer) are 1 or −1 and the sum of elements of each row is 2 or −2, elements of its inverse matrix have the same magnitude. In addition, the coefficient of the inverse matrix is ¼. The above third matrix $A_3$ corresponds to the case of N=2.

As described above, when the matrix A is a circulant matrix, the currents I[1]$_{t=1}$ to I[1]$_{t=7}$ probably have approximately the same magnitude. This means that the currents flowing through the signal line CL can be measured with approximately the same degree of errors.

An error (resolution) in a measurement of a physical quantity, including the current, depends on the absolute value of the physical quantity to be measured. For example, when a current of 1 mA is measured with an error of 1 μA, a current of 10 mA is rarely measured with an error of 1 μA. In general, a measurement error is proportional to the physical quantity of an object to be measured; thus, the current of 10 mA is measured with an error of approximately 10 μA. That is, it is difficult to ensure the same accuracy for measurement in a very wide range.

Furthermore, as described above, the current value i[1,1] is expressed as the polynomial of the currents I[1]$_{t=1}$ to I[1]$_{t=7}$. In this case, even though the currents I[1]$_{t=1}$ to I[1]$_{t=6}$ are measured with an error of 1 μA, if the current I[1]$_{t=7}$ is measured with an error of 10 μA, this polynomial gives an error of approximately 10 μA.

Therefore, in order to maintain the measurement accuracy, it is preferable that objects to be measured have approximately the same value. Since the currents flowing through the signal line CL can have approximately the same magnitude, measurement conditions are preferably set so that the matrix A is a circulant matrix.

The smaller the magnitude of the measured currents I[1]$_{t=1}$ to I[1]$_{t=7}$ is, the higher the measurement accuracy is. In this sense, as the sum of elements of each row of the above matrix A, 0 is the most preferable, and 1 is the second most preferable.

In this manner, the current values i[1,1] to i[7,8] can be expressed as polynomials. In general, these values can be obtained by substituting numerical values (the currents I[1]$_{t=1}$ to I[8]$_{t=7}$ and the elements of $A^{-1}$) into the polynomials. However, in the case where the matrix A is the third matrix $A_3$, the calculation amount can be reduced by the following special arithmetic operation.

As an example, the case where current values i[1,m] to i[8,m] (m is an integer of greater than or equal to 1 and less than or equal to 9) of a matrix device with eight rows and nine columns are calculated will be considered. From the inverse matrix $A_2^{-1}$ of the above third matrix $A_3$, $i[2,m]=½I[m]_{t=3}+½I[m]_{t=6}-i[1,m]$, $i[3,m]=½I[m]_{t=4}+½I[m]_{t=7}-i[2,m]$, $i[4,m]=½I[m]_{t=5}+½I[m]_{t=8}-i[3,m]$, $i[5,m]=½I[m]_{t=6}+½I[m]_{t=1}-i[4,m]$, $i[6,m]=½I[m]_{t=7}+½I[m]_{t=2}-i[5,m]$, $i[7,m]=½I[m]_{t=8}+½I[m]_{t=3}-i[6,m]$, $i[8,m]=½I[m]_{t=1}+½I[m]_{t=4}-i[7,m]$  [Formula 19]

is obtained. For example, the current value i[2,m] can be calculated if the current value i[1,m] is known, and the obtained current value i[2,m] can be used to calculate i[3,m]. Hence, only the current value i[1,m] is obtained by substituting numerical values (the currents I[1]$_{t=1}$ to I[8]$_{t=7}$ and the elements of $A^{-1}$) into the polynomial, whereas the other current values can be calculated by sequentially using the obtained results.

In a method in which numerical values are substituted into polynomials, the calculation amount increases enormously with an increase in the number of rows of a matrix device (when the number of rows increases twofold, the number of terms increases fourfold; accordingly, the amount of required calculation increases fourfold or more). In contrast, in the method of sequential calculation with obtained results, the calculation amount is substantially proportional to the number of rows; thus, this method becomes more advantageous as the number of rows becomes larger.

Figure 2B:
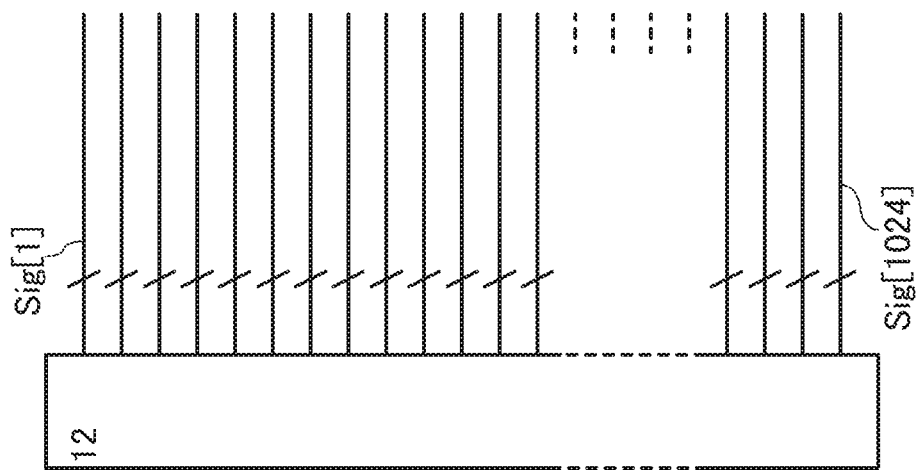

The matrix device may have a structure illustrated in FIG. 2(A) in which signals are directly input from a code signal driver 12 to the signal lines Sig or a structure illustrated in FIG. 2(B) in which a signal of the code signal driver 12 is input to the signal line Sig selected by a demultiplexer 13. In FIG. 2(B), one of 128 signal lines Sig is selected.

As described above, the amount of required arithmetic operation increases enormously with an increase in the number of rows of the matrix device; therefore, the measurement is preferably performed on a plurality of portions into which the matrix device is divided. For example, since the number of rows of the matrix device in FIG. 2(A) is 1024, the measurement is performed on every eight rows, namely the 1st to 8th rows, the 9th to 16th rows, the 17th to 24th rows, and so on. For example, while the pixels 11 in the 1st to 8th rows are measured, no current is supplied from the pixels 11 in the 9th to 1024th rows to the signal line CL.

Accordingly, a signal of the signal line Sig is required not only to control the direction of the current supplied from the pixel 11 to the signal line CL[1] but also to control whether or not a current is supplied.

Furthermore, in the device illustrated in FIG. 2(B), it is necessary that a signal of the signal line Sig which is not selected by the demultiplexer 13 do not cause a current to be supplied from the pixel 11 to the signal line CL[1].

The code signal driver 12 illustrated in FIG. 2(B) has a function of outputting signals corresponding to the matrix A to the respective terminals. For example, when the matrix A has eight rows, eight kinds of signals are output to eight terminals [1] to [8] in accordance with a reference clock signal or the like. For example, in the matrix device with 1024 rows, each of these eight signals is output from the 7-bit demultiplexer 13 to one of the 128 signal lines Sig.

Note that all the elements of the first row of a Hadamard matrix are the same. Accordingly, in the case where a Hadamard matrix is used as the matrix A, one terminal of the code signal driver 12 may be configured to output the same signal constantly during the measurement of current values.

Furthermore, in the case where a circulant matrix is used as the matrix A, the code signal driver 12 may include a shift register which can select one row (in the case of the first matrix $A_1$) or select two rows (in the case of the second matrix $A_2$), three rows (in the case of the third matrix $A_3$), or a larger number of rows at the same time.

The signal line Sig may be either a single wiring or a combination of a plurality of wirings. For example, one signal line Sig may be composed of two wirings.

Figure 3A:
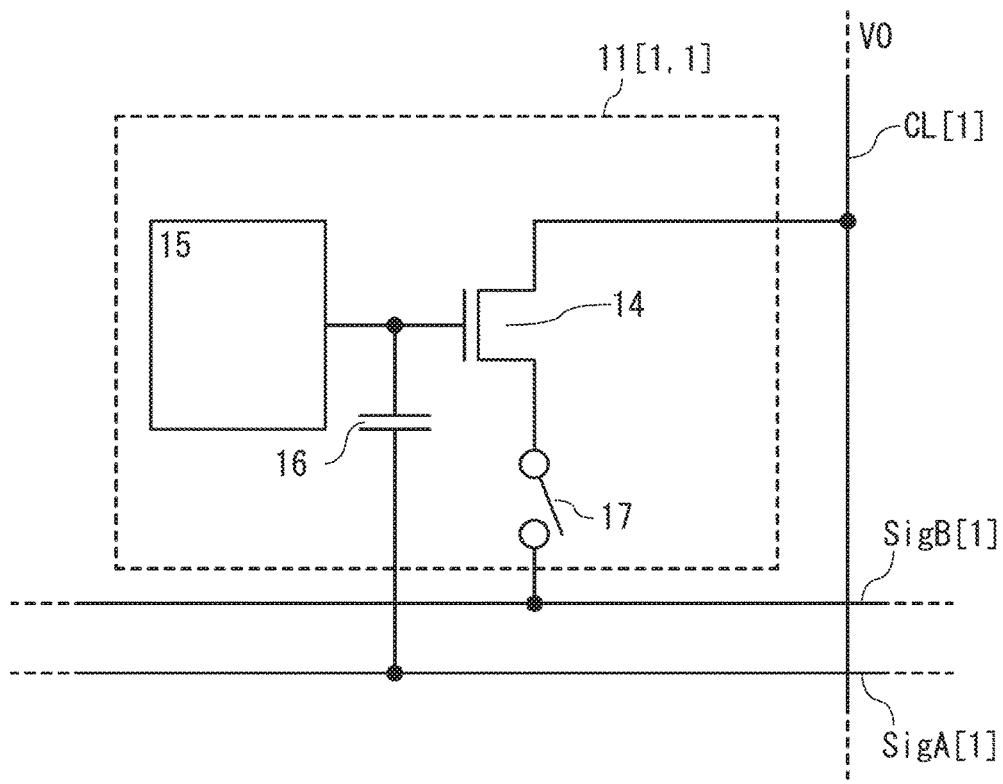
FIG. 3 Diagrams showing a circuit example and an operation example of a pixel.

FIG. 3(A) illustrates an example of a circuit of the pixel 11[1,1]. The pixel 11[1,1] includes a transistor 14, a potential supply circuit 15, a capacitor 16, and a switch 17. The capacitor 16 is provided between a gate of the transistor 14 and a first signal line SigA[1]. The switch 17 may be a single transistor, a circuit including a combination of a plurality of transistors, or the like. In addition, although the transistor 14 is an n-channel one here, a p-channel one may also be used.

In FIG. 3(A), a second signal line SigB[1] can be connected to the signal line CL[1] via the transistor 14 and the switch 17. Note that although being provided between the second signal line SigB[1] and the transistor 14 in FIG. 3(A), the switch 17 may be provided between the signal line CL[1] and the transistor 14. The switch 17 is on in the case where a current flows between the second signal line SigB[1] and the signal line CL[1], and is otherwise off. Note that the switch 17 is not necessarily provided. For example, in order that no current flow between the second signal line SigB[1] and the signal line CL[1], the potential of the second signal line SigB[1] is set equal to the potential of the signal line CL[1]. Alternatively, a similar function can be obtained when a potential that prevents the transistor 14 from being turned on is supplied from the potential supply circuit 15.

Here, the gate of the transistor 14 is supplied with a potential from the potential supply circuit 15. The potential supply circuit 15 has a function of bringing the gate into an electrically floating state (an electrically isolated state) after supplying the potential to the gate. Furthermore, since the capacitor 16 with sufficiently high capacitance is provided between the gate of the transistor 14 and the first signal line SigA[1], the potential of the gate of the transistor 14 fluctuates with the potential of the first signal line SigA[1]. Furthermore, the current direction can be changed depending on the magnitude relation between the potential of the second signal line SigB[1] and the potential of the signal line CL[1]. Furthermore, by setting the potential of the first signal line SigA[1] as appropriate, the potential difference between a source (either the second signal line SigB[1] or the signal line CL[1], which has a lower potential) and the gate of the transistor 14 can be constant regardless of the current direction.

Thus, the signal line Sig[1] can be regarded as being composed of the first signal line SigA[1] and the second signal line SigB[1]. Specific operation will be described below. In the following description, the switch 17 is turned on to supply a current to the signal line CL[1]. In addition, the potential of the signal line CL[1] is set to V0.

Figure 3B:
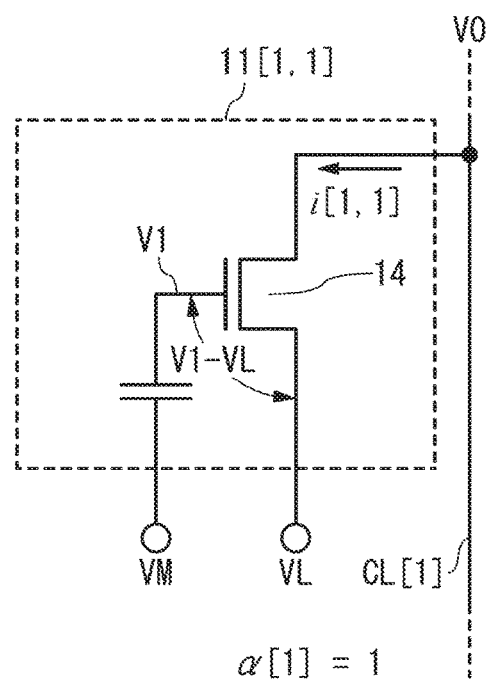

For example, when the potential of the first signal line SigA[1] is VM, the potential of the second signal line SigB[1] is VL (<V0), and the potential of the gate of the transistor 14 is V1, a current with the current value i[1,1] can flow from the signal line CL[1] to the pixel 11[1,1] as illustrated in FIG. 3(B). That is, α[1]=1.

Here, the potential of the gate of the transistor 14 is V1, and the potential of the source (in this case, the second signal line SigB[1] with the lower potential) is VL; thus, the gate-source potential difference is V1−VL. In order that the transistor 14 operate in a saturation region, for example, the gate-source potential difference is set to be smaller than the drain-source potential difference V0−VL.

Figure 3C:
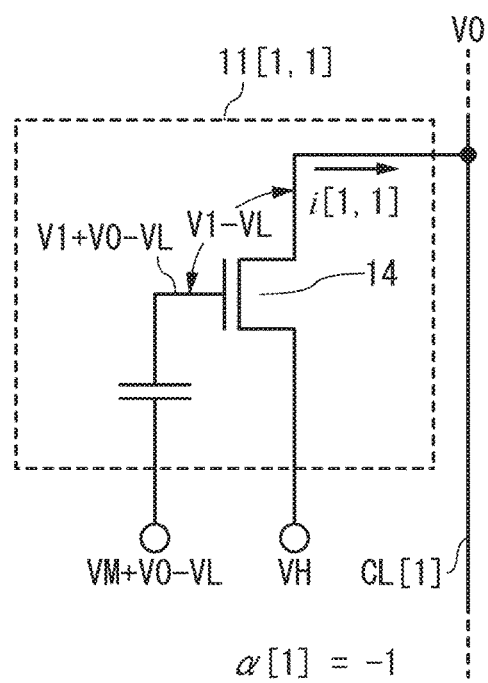

Furthermore, when the potential of the second signal line SigB[1] is VH (>V0), a current with the current value i[1,1] can flow from the pixel 11[1,1] to the signal line CL[1] as illustrated in FIG. 3(C). That is, α[1]=−1.

Here, the potential of the source of the transistor 14 (in this case, the signal line CL[1] with the lower potential) is V0. In order that the transistor 14 have a gate-source potential difference equal to that in FIG. 3(B), the potential of the first signal line SigA[1] is set to VM+V0−VL. The potential of the first signal line SigA[1] increases from VM by V0−VL, so that the potential of the gate of the transistor 14 also increases to V1+V0−VL by the same increment. Accordingly, the gate-source potential difference is V1−VL as in the case of FIG. 3(B).

Also in this case, the transistor 14 may be configured to operate in the saturation region. That is, the gate-source potential difference V1−VL of the transistor 14 is preferably smaller than the drain-source potential difference VH−V0.

Note that both in the case of FIG. 3(B) and in the case of FIG. 3(C), the drain-source current value of the transistor 14 operating in the saturation region ideally depends on only the gate-source potential difference and does not depend on the drain-source potential difference.

Note that the transistor 14 may operate in a region other than the saturation region; in this case, the magnitude of the current needs to be prevented from fluctuating depending on the current direction (the current needs to be prevented from fluctuating depending on the drain-source potential difference). Specifically, V0−VL=VH−V0, i.e., VH+VL=2V0 is preferably satisfied.

In this manner, the pixel 11[1,1] is controlled by the first signal line SigA[1] and the second signal line SigB[1], whereby the pixel 11[1,1] can supply the signal line CL[1] with a current whose direction can be changed.

Note that since the drain-source current value of the transistor 14 depends on the gate-source potential difference as described above, a measurement with a different gate-source potential difference may be performed in a similar manner.

Here, capacitance other than that of the capacitor 16 is ignored in FIG. 3(A); however, in an actual case, it may become necessary to take the existence of parasitic capacitance (except for the gate capacitance of the transistor 14) into account. For example, when parasitic capacitance that corresponds to 1% of the capacitance of the capacitor 16 exists at the gate of the transistor 14, the potential of the gate of the transistor 14 at the time when the potential of the second signal line SigB is VH is approximately 1% lower than that in an ideal state. That is, the gate-source potential difference also decreases by approximately 1%.

The source-drain current of the transistor 14 is determined in accordance with the gate potential, so that the current value i varies depending on the direction of the current I. In the case where the transistor 14 is in an ideal saturation state, the current value is proportional to the square of the gate-source potential difference, and thus, decreases by approximately 2%. Therefore, in the case of using the circuit illustrated in FIG. 3(A), required measurement accuracy and parasitic capacitance that exists in addition to the capacitance of the capacitor 16 need to be taken into account. Note that the gate capacitance of the transistor 14, which is supposed to be almost constant regardless of the potential of the second signal line SigB, may be left out of consideration.

In an example of a method for preventing an influence of such parasitic capacitance, when the potential of the gate of the transistor 14 is set to a predetermined potential, the potential of the signal line SigA[1] may be set to $$VM + \frac{V0 - VL}{2} C1. \qquad \text{[Formula 20]}$$

Subsequently, the gate of the transistor 14 is brought into an electrically floating state, and then, the potential of the signal line SigA[1] is set to VM or VM+V0−VL as illustrated in FIG. 3(B) or FIG. 3(C). In any case, the potential of the signal line SigA[1] behaves in the same manner and thus has the same influence, regardless of the presence of parasitic capacitance. However, this method fails to obtain an accurate potential of the gate of the transistor 14 at the time when the potential of the signal line SigA[1] is VM, for example.

Note that the current value i may change owing to long-term use; however, since parasitic capacitance is determined by the shape, the long-term use probably causes no fluctuation. Accordingly, if parasitic capacitance or its influence can be known by any method, α can include the contribution of the parasitic capacitance. For example, in the case where a current flows from the signal line CL to the pixel 11, α may be 1; in the case where the current direction is opposite, α may be −0.99. In this case, α differs between pixels. In the same manner as above, the current value i is calculated using an inverse matrix of a matrix whose elements are α.

For example, in the case where currents flow from the signal line CL to the pixels 11, i.e., the pixel 11[1,1], a pixel 11[2,1], a pixel 11[3,1], a pixel 11[4,1], a pixel 11[5,1], a pixel 11[6,1], a pixel 11[7,1], and a pixel 11[8,1], α is always 1; in the case where the current direction is opposite, α is −0.98, −0.99, −0.97, −0.99, −0.99, −0.98, −0.99, and −0.97, respectively. In this case, the above third matrix $A_3$ is corrected as follows:

$$A_3 = \begin{pmatrix} -0.98 & -0.99 & -0.97 & 1 & 1 & 1 & 1 & 1 \\ 1 & -0.99 & -0.97 & -0.99 & 1 & 1 & 1 & 1 \\ 1 & 1 & -0.97 & -0.99 & -0.99 & 1 & 1 & 1 \\ 1 & 1 & 1 & -0.99 & -0.99 & -0.98 & 1 & 1 \\ 1 & 1 & 1 & 1 & -0.99 & -0.98 & -0.99 & 1 \\ 1 & 1 & 1 & 1 & 1 & -0.98 & -0.99 & -0.97 \\ -0.98 & 1 & 1 & 1 & 1 & 1 & -0.99 & -0.97 \\ -0.98 & -0.99 & 1 & 1 & 1 & 1 & 1 & -0.97 \end{pmatrix} \qquad \text{[Formula 21]}$$

Figure 4A:
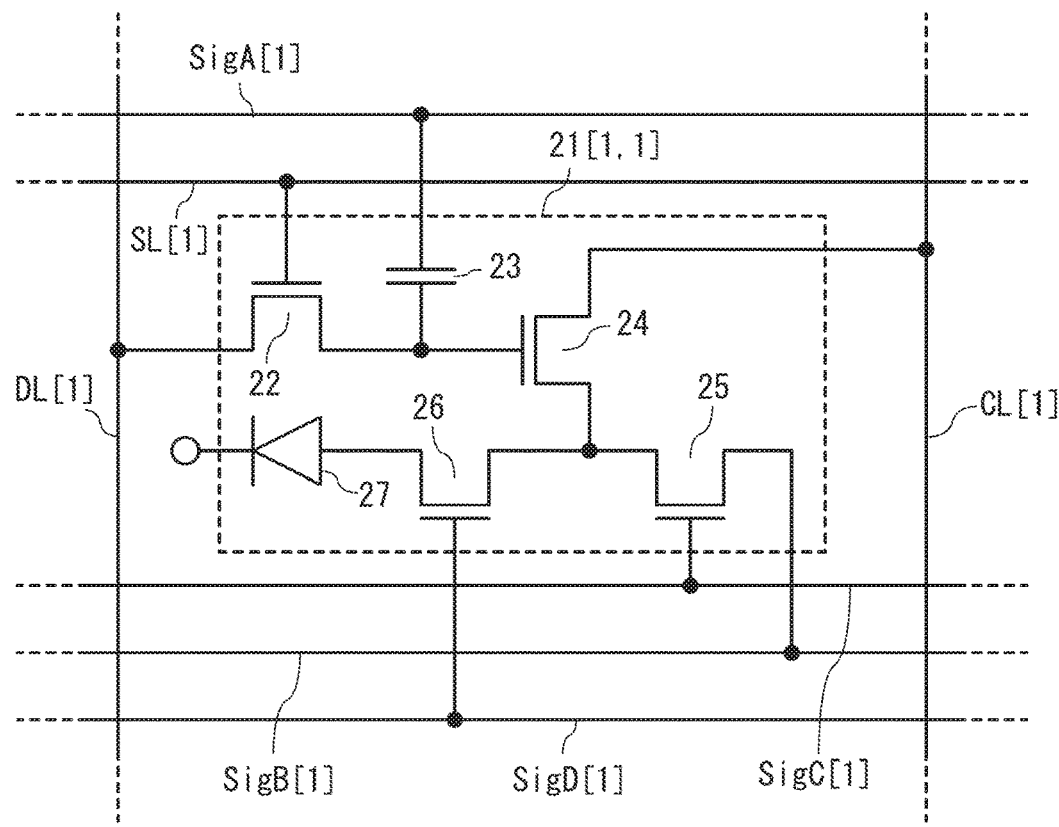
FIG. 4 Diagrams showing circuit examples of a display pixel.

Specific circuit examples will be shown below. FIG. 4(A) shows an example of a display pixel that is used for a display device in which light-emitting elements (light-emitting diodes) for respective pixels are arranged in a matrix. A display pixel 21[1,1] in the first row and the first column of the display device includes a selection transistor 22, a capacitor 23, a driver transistor 24, a transistor 25, a transistor 26, and a light-emitting element 27. Here, the capacitor 23, the driver transistor 24, and the transistor 25 correspond to the capacitor 16, the transistor 14, and the switch 17 in FIG. 3(A), respectively.

Here, the transistor 25 and the transistor 26 are controlled by a signal line SigC[1] and a signal line SigD[1], respectively.

Furthermore, the selection transistor 22 is controlled by a row selection line SL[1]. In an on state, it has a function of supplying a potential of a data line DL[1] to a gate of the driver transistor 24, and in an off state, it has a function of holding the potential. Thus, it corresponds to the potential supply circuit 15 in FIG. 3(A).

By the method described with reference to FIG. 3(A) to FIG. 3(C), the direction of a current flowing through the driver transistor 24 can be changed using the first signal line SigA and the second signal line SigB. Note that the display pixel 21[1,1] includes the light-emitting element 27; therefore, in order to prevent a current from flowing into the light-emitting element 27 at the time of measuring the current flowing through the driver transistor 24, the transistor 26 is preferably off in the current measurement. Note that the transistor 26 is not necessarily provided under condition where the magnitude of the current flowing through the driver transistor 24 does not change even when a current flows into the light-emitting element 27 (FIG. 4(B)).

Note that the current can be prevented from flowing into the light-emitting element 27 also by setting the potentials of the signal line CL[1] and the second signal line SigB[1] to appropriate values or by setting the potential of a cathode of the light-emitting element 27 to an appropriate value. Regarding the former, for example, the potentials of the signal line CL[1] and the second signal line SigB[1] are set so that the potential difference between an anode and the cathode of the light-emitting element 27 is smaller than the threshold value of the light-emitting element 27. Regarding the latter, similarly, the potential of the cathode of the light-emitting element 27 is set so that the potential difference between the anode and the cathode of the light-emitting element 27 is smaller than the threshold value of the light-emitting element 27 or a reverse bias is applied.

Figure 4B:
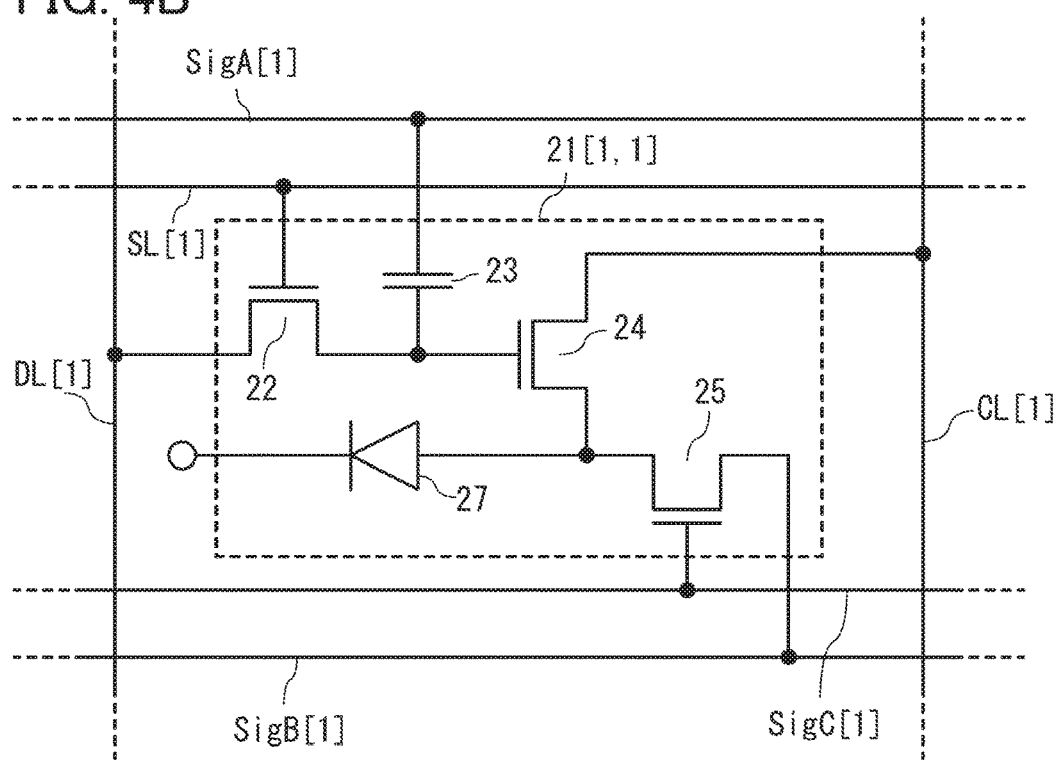

An example of the operation in the case of calculating the current value i of the driver transistor 24 of the display pixel 21[1,1] in FIG. 4(A) or FIG. 4(B) will be described. First, the selection transistor 22 is turned on. At this time, the potential of the first signal line SigA[1] is VM, and the potential of the second signal line SigB[1] is VL. Note that the potential of the signal line CL[1] is V0; this potential may also be V0 when display is performed in the display pixel 21[1,1].

Before the selection transistor 22 is turned off, the potential of the data line DL[1] is set to a first potential. Then, the selection transistor 22 is turned off. Similar operation is repeated in the other rows, so that the potentials of the gates of the driver transistors 24 of all the display pixels 21 that are to be subjected to the current measurement are set to the first potential. Here, even after the selection transistor 22 is turned off, the potential of the gate of the driver transistor 24 does not fluctuate.

After that, as described with reference to FIG. 3(B) and FIG. 3(C), the potentials of the first signal line SigA[1] and the second signal line SigB[1] are set in accordance with the direction of the current flowing through the driver transistor 24. The setting of the first signal lines SigA and the second signal lines SigB in other rows is concurrently performed. For example, a pattern of the second row of a Hadamard matrix is obtained. Furthermore, before or after that, the transistor 25 is turned on. Then, the current I flowing through the signal line CL is measured column by column.

Next, the potentials of the first signal line SigA and the second signal line SigB are set in accordance with a pattern of the directions of currents flowing through other driver transistors 24 (e.g., a pattern of the third row of the Hadamard matrix); at this time, the current I flowing through the signal line CL is measured column by column. The current value i of the driver transistor 24 of this display pixel 21[1,1] is calculated using the currents/measured by repeating such operation. Refer to the above description for the calculation method.

In the case where the potential of the gate of the driver transistor 24 is a second potential, the current value is calculated in a similar manner.

Figure 5A:
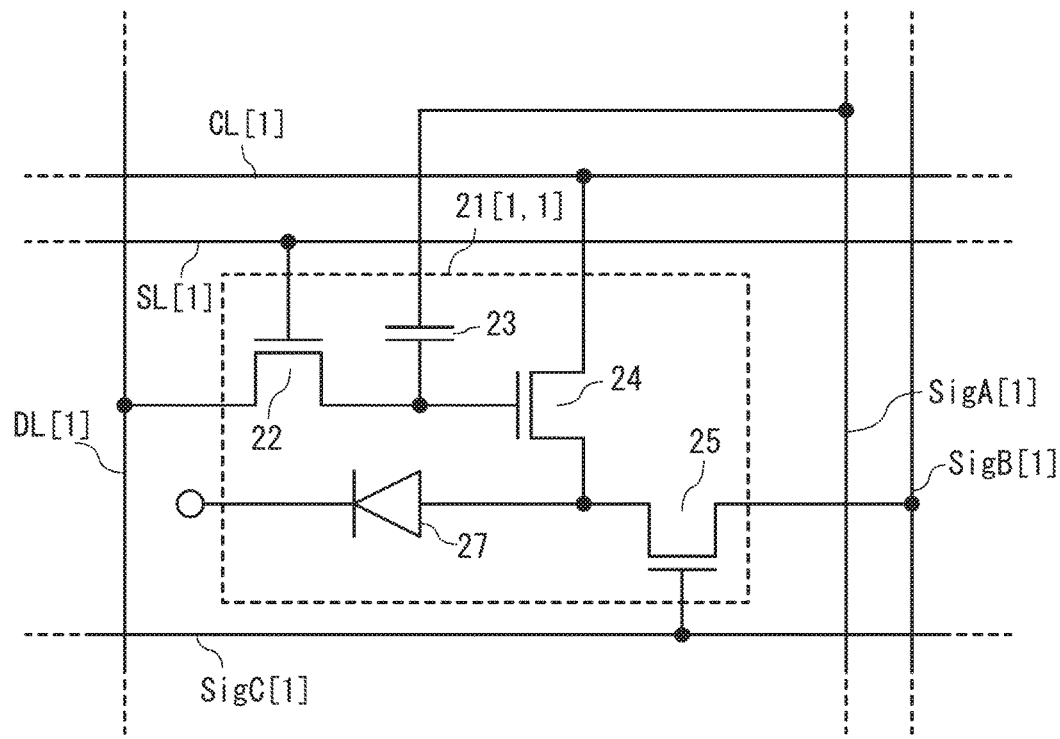
FIG. 5 Diagrams showing circuit examples of a display pixel.

FIG. 5(A) shows another example of a display pixel that is used for a display device in which light-emitting elements for respective pixels are arranged in a matrix. The display pixel 21[1,1] in FIG. 4(B) is designed so that the signal line SigA[1] and the signal line SigB[1] are parallel to the row selection line SL[1]. However, the design may be as in FIG. 5(A), in which the signal lines Sig[1] cross the row selection line SL[1]. In this case, the signal line SigA[1] and the signal line SigB[1] need to be designed to cross the signal line CL[1]; thus, the signal line CL[1] is designed to be parallel to the row selection line SL[1]. Such a modification is possible because the signal line CL[1] is used as a wiring for supplying a current and does not relate to row selection in data input.

In the configuration in FIG. 5(A), the code signal driver described with reference to FIG. 2(A) and FIG. 2(B) and a driver (data driver) for inputting a signal to the data line can be arranged on the same side. As a result, for example, the peripheral (bezel) width of the display device can be narrowed on a pair of opposite sides (sides which are not provided with the code signal driver 12).

Figure 5B:
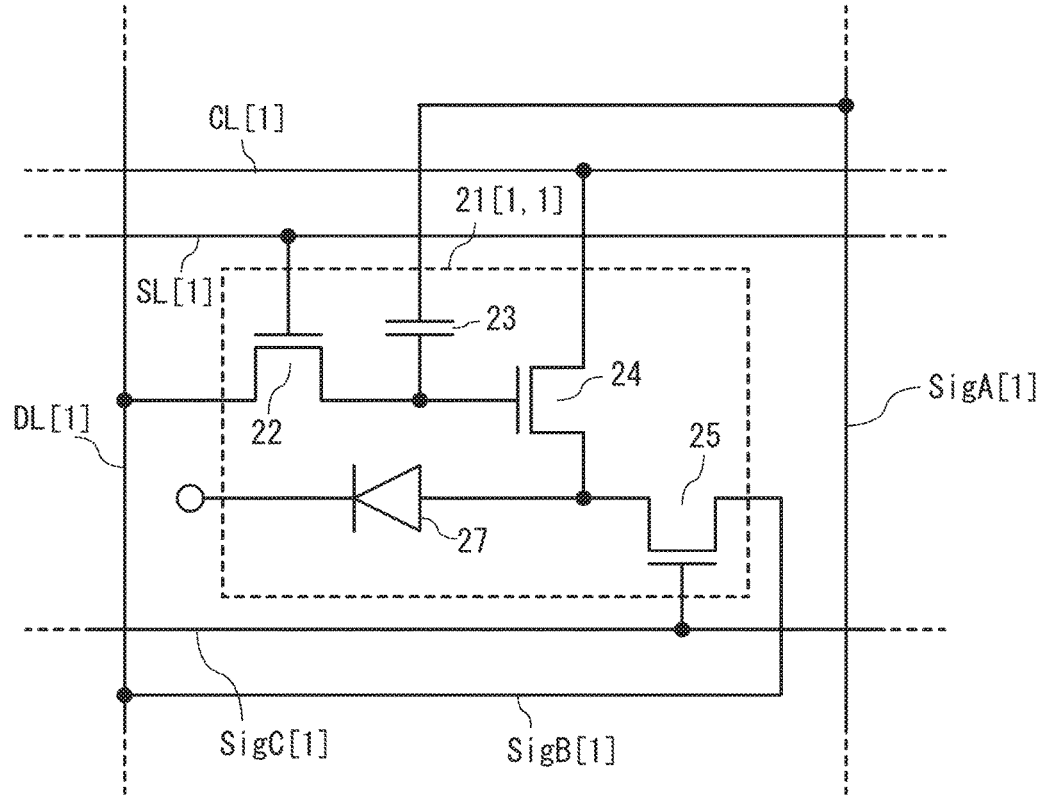

Note that the second signal line SigB[1] is used only in the current measurement. In contrast, the data line DL[1] is not used in the current measurement. Accordingly, one wiring can serve both as the second signal line SigB[1] and as the data line DL[1]. FIG. 5(B) shows such an example. In this example, the data line DL[1] can also be used as the second signal line SigB[1]; however, another data line (e.g., a data line DL[2]) may be designed to be used also as the second signal line SigB[1].

Figure 6A:
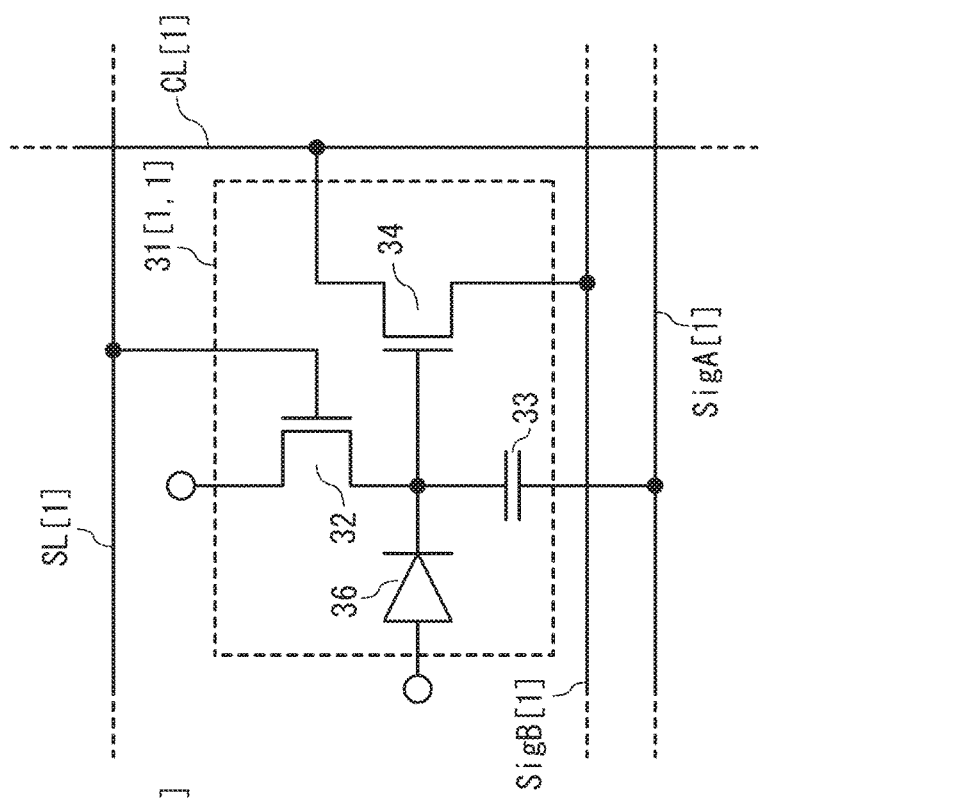
FIG. 6 Diagrams showing circuit examples of a display pixel.

FIG. 6(A) shows an example of a photodetector pixel that is used for an image sensor including photodetector elements (e.g., photodiodes) arranged in a matrix. A photodetector pixel 31[1,1] in the first row and the first column of the image sensor includes a reset transistor 32, a capacitor 33, an amplifier transistor 34, a transistor 35, a transistor 36, and a photodetector element 37.

Here, the capacitor 33, the amplifier transistor 34, and the transistor 35 correspond to the capacitor 16, the transistor 14, and the switch 17 in FIG. 3(A), respectively. Note that the transistor 35 is controlled by the signal line SigC[1]. In this drawing, a source and a drain of the transistor 35 are provided between the signal line SigB[1] and the amplifier transistor 34; however, the source and the drain may be provided between the signal line CL[1] and the amplifier transistor 34.

The reset transistor 32 and the photodetector element 37 have a function of supplying and holding a potential necessary for a gate of the amplifier transistor 34 and thus correspond to the potential supply circuit 15 in FIG. 3(A). The transistor 36 is provided between the gate of the amplifier transistor 34 and a cathode of the photodetector element 37 and controlled by a signal line SigE[1]. Thus, the cathode of the photodetector element 37 and the gate of the amplifier transistor 34 can be connected to each other as necessary.

For example, fluctuation of the potential of the first signal line SigA[1] causes fluctuation of the potential of the gate of the amplifier transistor 34, which may result in that the potential of the cathode of the photodetector element 37 becomes lower than the potential of its anode. This might lead to a malfunction. In such a case, therefore, the transistor 36 is turned off. Note that even without the transistor 36, the potential of the cathode of the photodetector element 37 can be prevented from becoming lower than the potential of the anode.

By the method described with reference to FIG. 3(A) to FIG. 3(C), the direction of a current flowing through the amplifier transistor 34 can be changed using the first signal line SigA and the second signal line SigB. Note that in the case where the drain-source current value of the amplifier transistor 34 is measured as a characteristic of the amplifier transistor 34, it may be measured in an environment in which the photodetector element 37 is not exposed to light, while the potential necessary for the gate of the amplifier transistor 34 is held using the reset transistor 32.

Note that in the case where light intensity measurement and data transmission are performed using the photodetector pixel 31[1,1], the photodetector pixel 31 is selected by turning on the transistor 35. Therefore, a configuration may be employed in which a signal from a driver for selecting a row (row selection driver) can also be input to the signal line SigC.

Figure 6B:
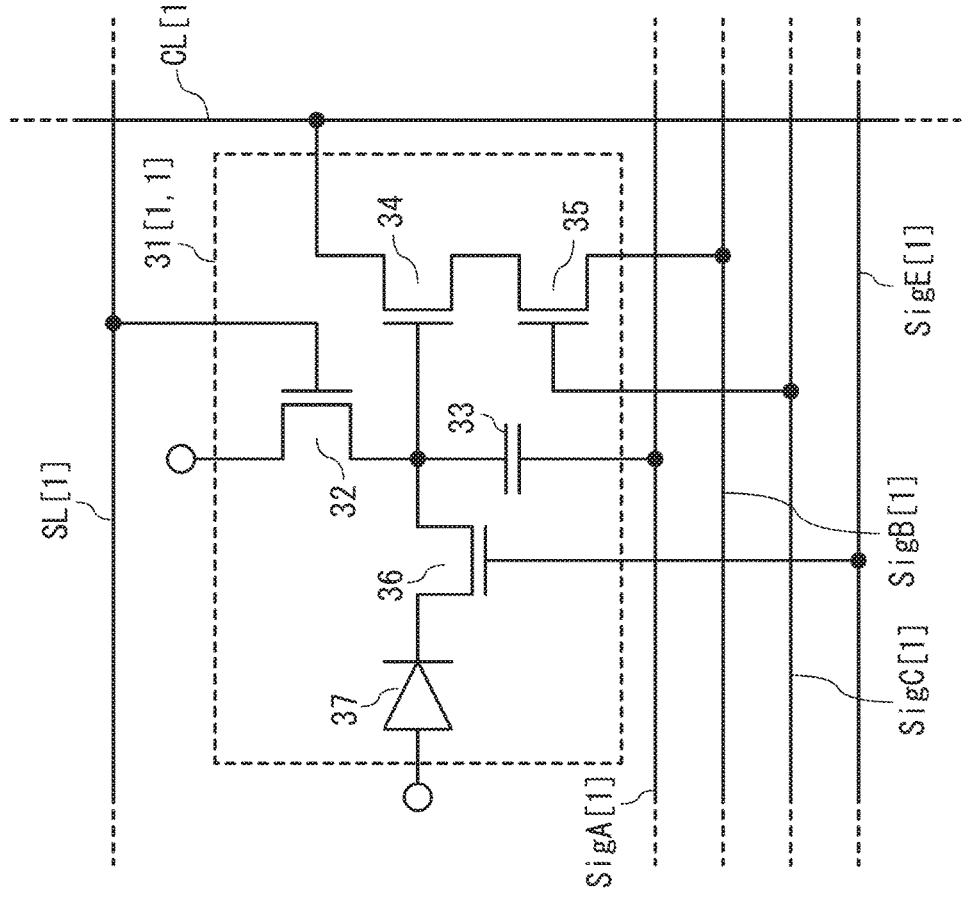

Note that the transistor 35 need not necessarily be used to select or not to select the photodetector pixel 31. FIG. 6(B) shows such an example. In the photodetector pixel 31[1,1] illustrated in FIG. 6(B), the transistor 36 is also omitted.

In the case where the photodetector pixel 31 is not selected, the potential of the second signal line SigB[1] is preferably equal to the potential of the signal line CL[1]. Note that in the current measurement, the potential of the second signal line SigB[1] is set to VH or VL in accordance with a code signal as illustrated in FIG. 3(B) and FIG. 3(C).

As for the photodetector pixels 31, by measuring currents flowing from the signal line CL[1] to the photodetector pixels 31 in a plurality of rows, not only data for correcting variation in the characteristics of the amplifier transistors 34 but also the outputs of the photodetector elements 37 can be obtained. In this case, the current values of the respective amplifier transistors 34 (which depend on the outputs of the photodetector elements 37) are obtained with high accuracy as described above. Consequently, image data (imaging data) with little noise can be obtained.

Figure 7A:
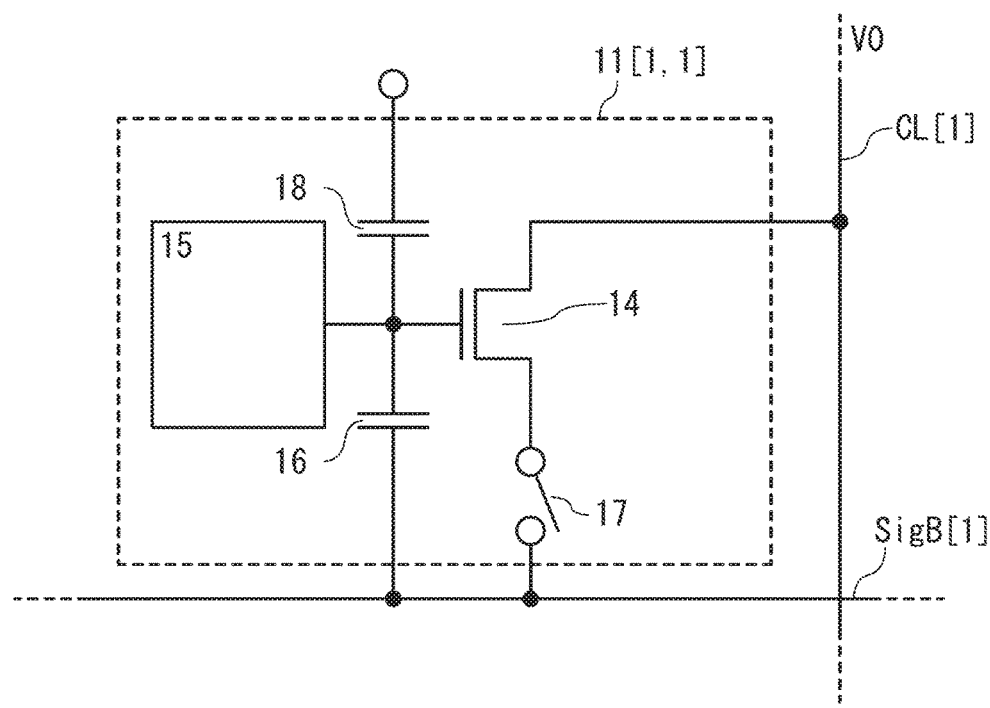
FIG. 7 Diagrams showing circuit examples and operation examples of a pixel.

In the above example, the first signal line SigA and the second signal line SigB are used as the signal line Sig and their potentials are individually set; however, with the second signal line SigB alone, operation similar to that in FIG. 3(A) can be performed by adding a capacitor 18 as illustrated in FIG. 7(A), for example. Note that the capacitances of the capacitor 16 and the capacitor 18 need to be strictly controlled. The reason for this will be explained below.

Figure 7B:
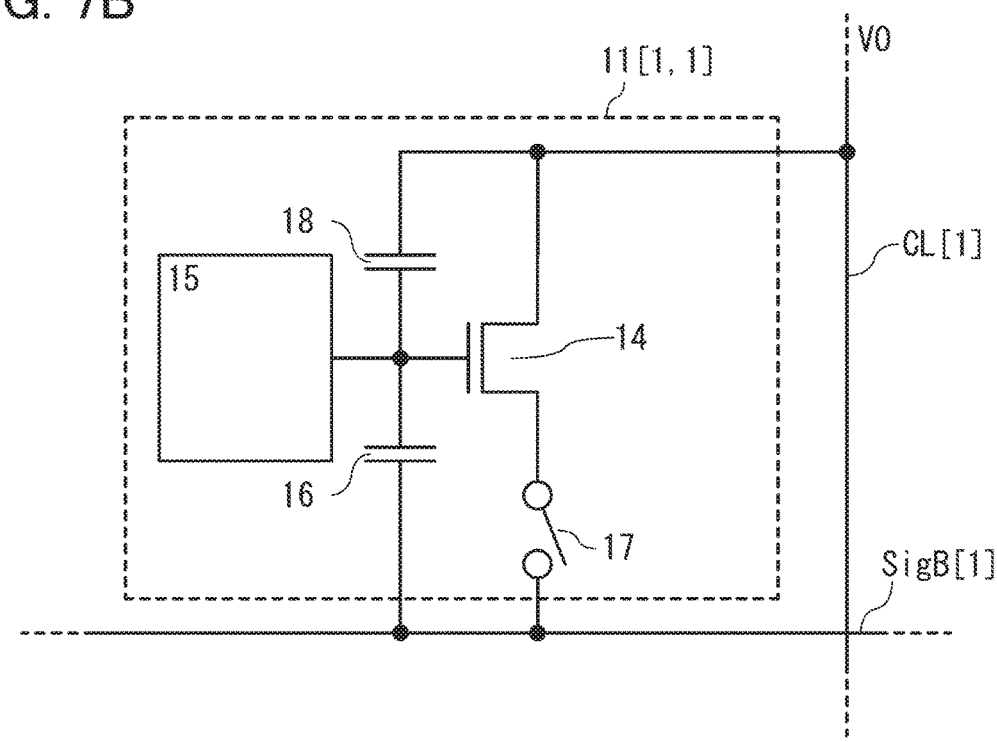

Here, the capacitance of the capacitor 16 is denoted by C1, and the capacitance of the capacitor 18 is denoted by C2. Here, one electrode of the capacitor 18 is held at the potential of the gate of the transistor 14, and the other electrode is held at a constant potential and may be connected to the signal line CL[1] as illustrated in FIG. 7(B), for example.

As described above, the potential of the second signal line SigB is VH or VL; when the potential of the second signal line SigB is VL, the potential of the gate of the transistor 14 is V1. According to the law of conservation of charge, when the potential of the second signal line SigB is VH, the potential of the gate of the transistor 14 is represented by $$V1 + \frac{C1}{C1+C2}(VH - VL). \qquad \text{[Formula 22]}$$

Here, the capacitance C2 is set so that the second term goes to V0−VL, namely, $$C2 = \frac{VH - V0}{V0 - VL}C1. \qquad \text{[Formula 23]}$$

For example, when VH+VL=2V0 is satisfied, the capacitance C2 is set equal to the capacitance C1.

Here, even a slight difference between the capacitance C1 and the capacitance C2 affects the accuracy. For example, when C1 is 1% higher than C2, the potential of the gate of the transistor 14 at the time when the potential of the second signal line SigB is VH is approximately 1% higher than that in an ideal state. That is, the gate-source potential difference also increases by approximately 1%. The source-drain current of the transistor 14 is determined in accordance with the gate potential, so that the current value i varies depending on the direction of the current I. In the case where the transistor 14 is in an ideal saturation state, the current value is proportional to the square of the gate-source potential difference, and thus, increases by approximately 2%. Therefore, in the case of using the circuit illustrated in FIG. 7(A), required measurement accuracy and accuracy in processing the capacitor 16 and the capacitor 18 need to be taken into account.

For example, when the margin of error in the current measurement is 2%, an acceptable difference between the capacitance C1 and the capacitance C2 is less than 1%; however, when the margin of error in the current measurement is required to be 0.2%, the difference between the capacitance C1 and the capacitance C2 needs to be less than 0.1%. Note that such a capacitance difference can also be corrected by the above-described method.

Figure 8A:
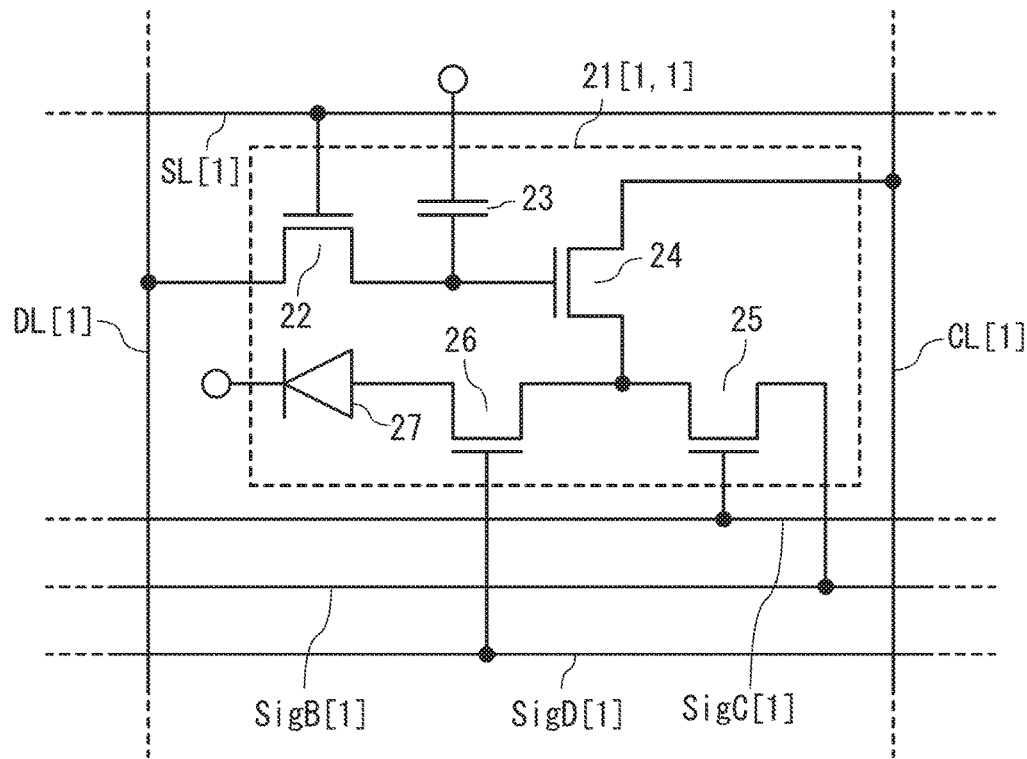
FIG. 8 Diagrams showing circuit examples of a display pixel.

The display pixel 21[1,1] illustrated in FIG. 8(A) is a modification of the display pixel 21[1,1] illustrated in FIG. 4(A) and has a structure in which one of the electrodes of the capacitor 23, which is connected to the first signal line SigA[1] in FIG. 4(A), is held at a fixed potential. Note that a structure without the capacitor 23 may also be employed.

To change the current direction in this circuit, the selection transistor 22 is turned on, the gate of the driver transistor 24 is set at an appropriate potential, and then, the selection transistor 22 is turned off. That is, when the potential of the second signal line SigB[1] is set to VL, the potential of the gate of the driver transistor 24 is set to V1; when the potential of the second signal line SigB[1] is set to VH, the potential of the gate of the driver transistor 24 is set to V1+V0−VL. In this manner, the above-described influence of parasitic capacitance can be reduced. Note that the potential of the gate of the driver transistor 24 may be set to a different value. For example, in accordance with the characteristics of the pixel 11, the potential of the gate of the driver transistor 24 may be changed from the above one.

This method requires the potential of the gate of the driver transistor 24 to be set as above with sufficient accuracy; first of all, the potential of the data line DL[1] needs to be closely controlled. Moreover, in particular, voltage fluctuation at the time of turning off the selection transistor 22 needs to be sufficiently reduced. Refer to the above description for the influence of the potential of the gate of the driver transistor 24 on the current value.

Figure 8B:
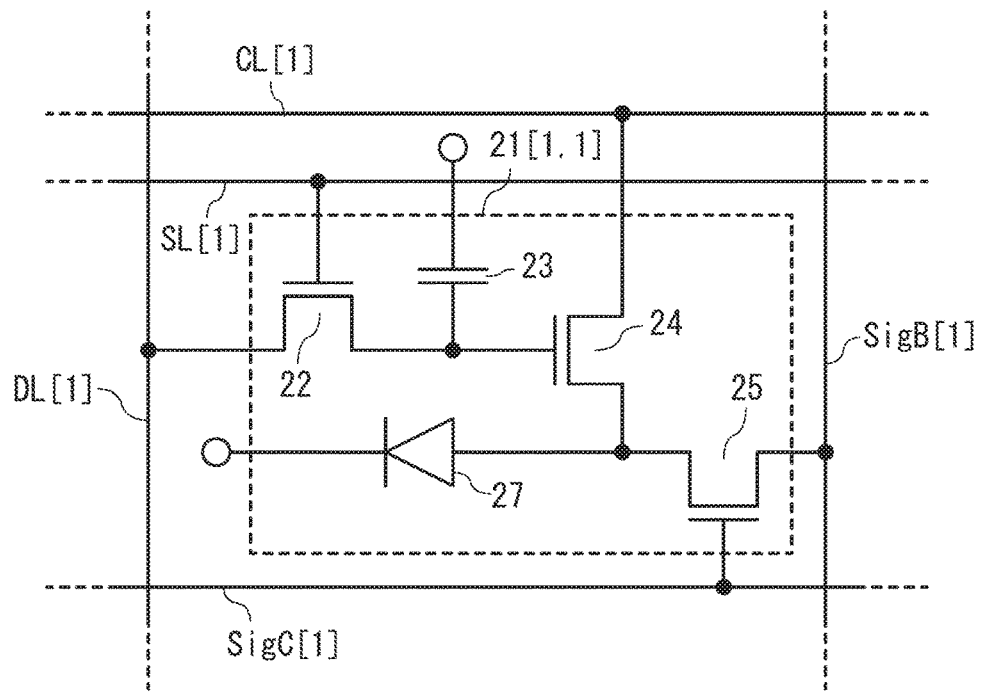

The display pixel 21[1,1] illustrated in FIG. 8(B) is a modification of the display pixel 21[1,1] illustrated in FIG. 5(A) and has a structure in which one of the electrodes of the capacitor 23, which is connected to the first signal line SigA[1] in FIG. 5(A), is held at a fixed potential. Note that a structure without the capacitor 23 may also be employed.

The circuit of this example is designed so that the selection transistors 22 of the display pixels 21 in a plurality of rows that are to be subjected to the current measurement are turned on at the same time.

To change the current direction in this circuit, the selection transistor 22 is turned on, and the data line DL[1] is set at an appropriate potential. That is, when the potential of the second signal line SigB[1] is set to VL, the potential of the data line DL[1] is set to V1; when the potential of the second signal line SigB[1] is set to VH, the potential of the data line DL[1] is set to V1+V0−VL. The potentials of the other data lines DL are also set in accordance with the potentials of the corresponding second signal lines SigB. Since the selection transistor 22 is on, the potential of the gate of the driver transistor 24 is substantially equal to the potential of the data line DL[1].

In this manner, the above-described influence of parasitic capacitance can be reduced. In addition, as compared with the case illustrated in FIG. 8(A), the potential of the gate of the driver transistor 24 can be prevented from fluctuating owing to leakage current of the selection transistor 22 in a period in which the selection transistor 22 is off. This method also prevents the potential of the gate of the driver transistor 24 from fluctuating when the selection transistor 22 is turned off.

Note that even in the case where the circuit is not designed so that the selection transistors 22 of the display pixels 21 in a plurality of rows that are to be subjected to the current measurement are turned on at the same time, the fluctuation of the potential of the gate of the driver transistor 24 can be suppressed by setting the potential of the data line DL[1] in accordance with the potential of the second signal line SigB[1].

Figure 9A:
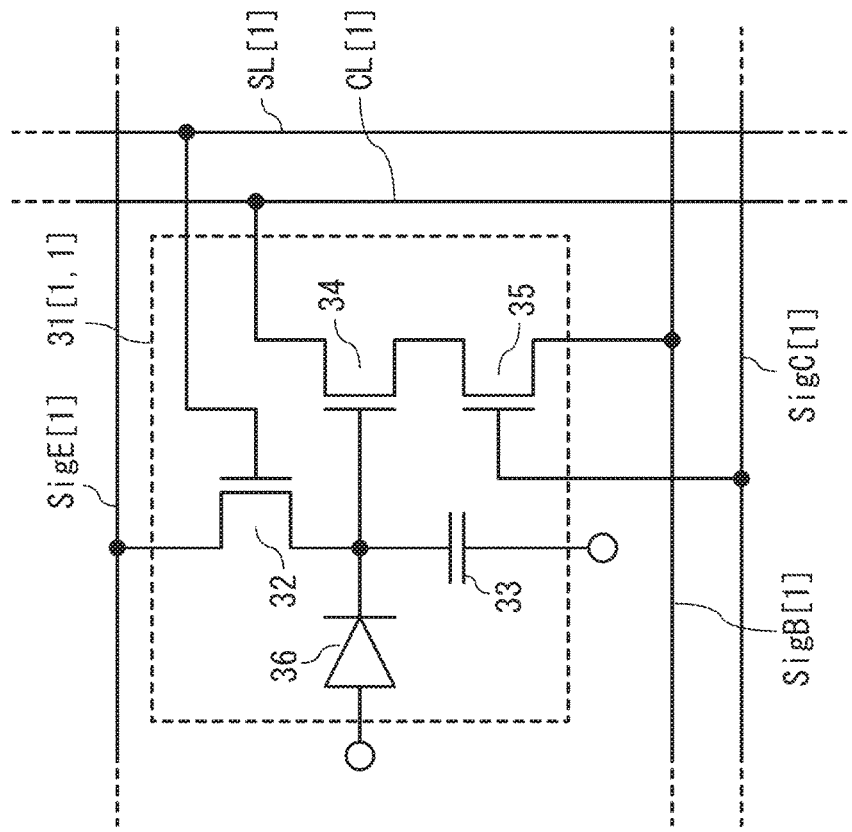
FIG. 9 Diagrams showing circuit examples of a photodetector pixel.

The above technique can also be applied to the photodetector pixel 31[1,1] illustrated in FIG. 6(A) or FIG. 6(B). In FIG. 9(A), which shows a modification example of the photodetector pixel 31[1,1] illustrated in FIG. 6(A), one of the electrodes of the capacitor 33, which is connected to the first signal line SigA[1] in FIG. 6(A), is held at a fixed potential. Note that a structure without the capacitor 33 may also be employed.

In this example, the reset transistors 32 can be controlled row by row. Furthermore, when the reset transistor 32 is on, the potential of the gate of the amplifier transistor 34 is equal to the potential of a signal line SigF[1]. Note that this arrangement of the signal line SigF enables the gates of the amplifier transistors 34 of the photodetector pixels 31 in the same row to have the same potential.

For example, the potential of the signal line SigF[1] is set in accordance with the potential of the second signal line SigB[1], whereby the current direction can be changed as in the photodetector pixel 31[1,1] illustrated in FIG. 6(A). Specifically, when the potential of the second signal line SigB[1] is VL, the potential of the signal line SigF[1] is set to V1; when the potential of the second signal line SigB[1] is VH, the potential of the signal line SigF[1] is set to V1+V0−VL. After that, the reset transistor 32 is turned off. In this manner, the above-described influence of parasitic capacitance can be reduced.

Figure 9B:
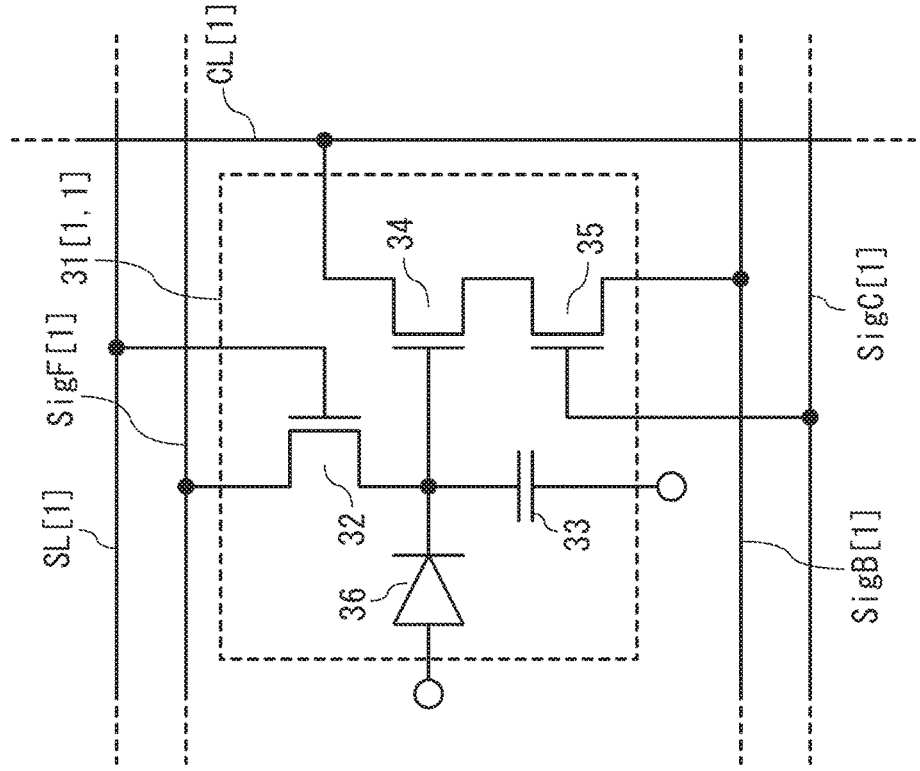

Furthermore, for example, in the case where the circuit is designed as in FIG. 9(B), in which the reset transistors 32 of the photodetector pixels 31 in a plurality of rows that are to be subjected to the current measurement are turned on at the same time, the reset transistors 32 are preferably on during the current measurement. Since the reset transistor 32 is on, the potential of the gate of the amplifier transistor 34 is substantially equal to the potential of the signal line SigF[1], and the potential of the gate of the amplifier transistor 34 can be prevented from fluctuating owing to leakage current of the reset transistor 32 in a period in which the reset transistor 32 is off.

Note that even in the case where the circuit is not designed so that the reset transistors 32 of the photodetector pixels 31 in a plurality of rows that are to be subjected to the current measurement are turned on at the same time, the fluctuation of the potential of the gate of the amplifier transistor 34 can be suppressed by setting the potential of the signal line SigF[1] in accordance with the potential of the second signal line SigB[1].

The above description is made on the assumption that potential fluctuation due to a wiring resistance and a current is negligible. In general, potential fluctuation is more significant when a wiring is longer or a higher current flows; thus, one wiring may have a non-negligible potential difference that depends on the position. For example, in the state illustrated in FIG. 3(C), the potential of the source of the transistor 14 can possibly no longer be regarded as V0 depending on the resistance and the current of the signal line CL[1].

In such a case, the source-drain potential difference (V1−VL) in FIG. 3(B) might be different from the source-drain potential difference in FIG. 3(C). If this is simply determined by the position in the wiring, it can be dealt with the above-described correction method.

In the method shown above, however, since currents supplied from a plurality of pixels flow via part of the signal line CL into another plurality of pixels, the local potential fluctuation has to be taken into account as well. Therefore, whether the potential fluctuation is negligible in practice needs to be determined considering a wiring resistance and a (local) current. For example, in the case where successive N pixels that can supply currents to the signal line CL are used and the current value i of each pixel is measured by the method shown above, the condition represented by $$\Delta V1 \geq \frac{RN^2 i_{max}}{v} \quad \text{[Formula 24]}$$

needs to be satisfied to ignore such potential fluctuation.

Here, $\Delta V1$ denotes an acceptable (negligible) error in the potential of the gate of the transistor 14, R denotes the resistance per unit length of the signal line CL, $v$ denotes the pixel density per unit length, and $i_{max}$ denotes the maximum value of the current values of the N pixels.

For example, $\Delta V1$ is 2 mV, R is 100 Ω/cm, $v$ is 100/cm, and $i_{max}$ is 10 μA; N=8 satisfies the condition because the right side of the above formula goes to 0.64 mV, whereas N=16 does not satisfy the condition because it goes to 2.6 mV. This indicates that the largest potential difference in the signal line CL for eight pixels is 0.64 mV.

Note that potential fluctuation caused when a different current flows through the signal line CL is substantially determined by the position. For example, in the case where the length of the signal line CL is 10 cm and the highest current that flows in the current measurement is 10 μA, the potential fluctuation (i.e., the maximum value of the potential difference that depends on the position in the signal line CL) is 10 mV. Since this value is determined in accordance with the position, it can be dealt with the above-described correction method.

Note that in the case where the sum is 0 in each row of the above-described matrix A, the magnitude of an actually measured current is at most N/2 of the standard deviation of the current values of the measured pixels. Thus, as the current value less varies, the magnitude of the measured current is smaller; accordingly, the potential fluctuation due to the resistance and the current of the signal line CL is reduced. For example, when the magnitude of the actually measured current is 1 μA in the above example, the maximum value of the potential difference that depends on the position in the signal line CL is 1 mV; consequently, no correction is necessary.

A similar discussion on the signal line SigB also needs to be considered.

The above current measurement includes measurement of potential fluctuation due to charge injection/extraction into/from a capacitor with a certain capacitance as well as measurement of permanent or temporary fluctuation of a physical quantity (including a potential, a magnetic field, time, a temperature, and the like) which is directly or indirectly caused by a current or determination of the magnitude relation.

Besides the use for the above measurement of the current values (which are determined by the gate potentials and the like) of the transistor 14, the driver transistor 24, and the amplifier transistor 34, the circuits illustrated in FIG. 3 to FIG. 9 can be used for other applications.

REFERENCE NUMERALS

11: pixel
12: code signal driver

13: demultiplexer
14: transistor
15: potential supply circuit
16: capacitor
17: switch
18: capacitor
21: display pixel
22: selection transistor
23: capacitor
24: driver transistor
25: transistor
26: transistor
27: light-emitting element
31: photodetector pixel
32: reset transistor
33: capacitor
34: amplifier transistor
35: transistor
36: transistor
37: photodetector element
CL: signal line
SL: row selection line
DL: data line
Sig: signal line
SigA: signal line
SigB: signal line
SigC: signal line
SigD: signal line
SigE: signal line
SigF: signal line
i: current value
I: current

The invention claimed is:
1. A measurement method for a device comprising:
N components;
a first wiring; and
second wirings which cross the first wiring,
wherein N is an integer of two or more,
wherein each component is configured to supply the first wiring with a current whose direction is configured to be changed,
wherein each component comprises a potential supply circuit, a transistor, and a capacitor,
wherein the device is designed so that, at a point in time, one of a source and a drain of the transistor has a potential equal to that of the first wiring and the other of the source and the drain of the transistor has a potential equal to that of a third wiring, and
wherein the device is designed so that a potential of the second wiring in the case where each component supplies the first wiring with a current in a first direction is different from a potential of the second wiring in the case where each component supplies the first wiring with a current in a second direction opposite to the first direction,
wherein the method comprises:
a process in which the current directions of the N components are individually set and a current flowing through the first wiring is measured N times; and
a process in which a magnitude of a current flowing through each electrical element in the N components is calculated on a basis of currents I[1] to I[N] obtained by the N measurements and combinations of the current directions of the components in the N measurements, whereby a magnitude of the current supplied from the component to the first wiring is determined,
wherein:
the N measurements differ from each other in combination of the current directions of the N components, and
the magnitude of the current flowing through each electrical element is calculated using a polynomial of the currents I[1] to I[N].

2. The measurement method according to claim 1, wherein the device further comprises N third wirings,
wherein the device is designed so that each third wiring has a potential equal to that of an electrode of the capacitor of the corresponding component, and
wherein the device is designed so that a potential of the third wiring in the case where each component supplies the first wiring with the current in the first direction is different from a potential of the third wiring in the case where each component supplies the first wiring with the current in the second direction.

3. The measurement method according to claim 1, wherein the device is designed so that a potential of a gate of the transistor of each component in the case where each component supplies the first wiring with the current in the first direction is different from that in the case where each component supplies the first wiring with the current in the second direction.

4. A matrix device configured to execute the measurement method according to claim 1.

5. The matrix device according to claim 4, wherein the matrix device is a display device or a photodetector device.

6. A method for driving a matrix device, wherein input or output data is corrected on the basis of current values of components measured by the measurement method according to claim 1.

7. A measurement method for a device comprising:
components arranged in a matrix with N rows and M columns (N and M are each an integer of two or more);
M first wirings; and
N second wirings which cross the first wirings,
wherein each component is configured to supply one of the M first wirings with a current whose direction is configured to be changed,
wherein each component comprises a potential supply circuit, a transistor, and a capacitor,
wherein the device is designed so that, at a point in time, one of a source and a drain of the transistor of each component has a potential equal to that of the first wiring and the other of the source and the drain of the transistor has a potential equal to that of the second wiring, and
wherein the device is designed so that a potential of the second wiring in the case where each component supplies the first wiring with a current in a first direction is different from a potential of the second wiring in the case where each component supplies the first wiring with a current in a second direction opposite to the first direction,
wherein the method comprises:
a process in which the potentials of the N second wirings are individually set and currents flowing through the M first wirings are each measured N times, and
a process in which a magnitude of a current flowing through each electrical element in an m-th column (m is an integer of 1 or more and M or less) is calculated on a basis of currents I[1,m] to I[N,m] of the first wiring in the m-th column, which are obtained by the N measurements, and combinations of the potentials of the N second wirings in the N measurements, whereby a magnitude of the current supplied from each component to the corresponding first wiring is determined, wherein:
- the N measurements differ from each other in combination of the potentials of the N second wirings, and
- the magnitude of the current flowing through each electrical element in the m-th column is calculated using a polynomial of the currents I[1,m] to I[N,m].

8. The measurement method according to claim 7, wherein:
- the polynomial of the currents I[1,m] to I[N,m] is expressed as a product of an inverse matrix of a square matrix A with N rows and a matrix with N rows and M columns whose elements are the currents I[1,m] to I[N,m], and
- no element of the inverse matrix of the square matrix A with N rows is 0.

9. The measurement method according to claim 8, wherein all the elements of the inverse matrix of the square matrix A with N rows have the same magnitude.

10. The measurement method according to claim 8, wherein the square matrix A with N rows is a Hadamard matrix.

11. The measurement method according to claim 8, wherein the square matrix A with N rows is a circulant matrix.

12. The measurement method according to claim 8, wherein:
- N is a multiple of 4, and
- the sum of elements of a given row of the square matrix A with N rows is 2 or 2.

\* \* \* \* \*